United States Patent
Yeh et al.

(10) Patent No.: US 12,476,215 B2
(45) Date of Patent: Nov. 18, 2025

(54) POWER DELIVERY STRUCTURES AND METHODS OF MANUFACTURING THEREOF

(71) Applicant: Taiwan Semicondutor Manufacturing Company, Ltd., Hsinchu (TW)

(72) Inventors: Ting-Yu Yeh, Hsinchu (TW); Han-Hsiang Huang, Hsinchu (TW); Chun-Hsien Wen, Hsinchu (TW); Chih-Wei Chang, Hsinchu (TW)

(73) Assignee: Taiwan Semicondutor Manufacturing Company, Ltd., Hsinchu (TW)

( * ) Notice: Subject to any disclaimer, the term of this patent is extended or adjusted under 35 U.S.C. 154(b) by 672 days.

(21) Appl. No.: 17/864,953

(22) Filed: Jul. 14, 2022

(65) Prior Publication Data

US 2024/0021560 A1  Jan. 18, 2024

(51) Int. Cl.
*H01L 23/00* (2006.01)
*H01L 21/66* (2006.01)

(52) U.S. Cl.
CPC ............ *H01L 24/20* (2013.01); *H01L 22/14* (2013.01); *H01L 24/19* (2013.01); *H01L 24/24* (2013.01); *H01L 2224/19* (2013.01); *H01L 2224/2105* (2013.01); *H01L 2224/211* (2013.01); *H01L 2224/221* (2013.01); *H01L 2224/24137* (2013.01)

(58) Field of Classification Search
CPC ......... H01L 24/20; H01L 24/19; H01L 24/24; H01L 22/14; H01L 2224/19; H01L 2224/2105; H01L 2224/211; H01L 2224/221; H01L 2224/24137; H01L 23/5286

See application file for complete search history.

(56) References Cited

U.S. PATENT DOCUMENTS

2021/0066219 A1 * 3/2021 Chen ....................... H01L 23/66

* cited by examiner

*Primary Examiner* — Ali Naraghi
*Assistant Examiner* — Christina A Sylvia
(74) *Attorney, Agent, or Firm* — FOLEY & LARDNER LLP

(57) ABSTRACT

A semiconductor device includes a first connector, a second connector, and a redistribution structure disposed between the first connector and the second connector. The redistribution structure includes a first connection tree electrically connecting the first connector to the second connector. The first connection tree includes a plurality of first conductive pads disposed in a plurality of respective levels, and a plurality of first via structures each disposed between adjacent ones of the plurality of first conductive pads. Any lateral end of each of the plurality of first conductive pads is spaced from the first connector within a first minimum pitch associated with the second connector.

18 Claims, 17 Drawing Sheets

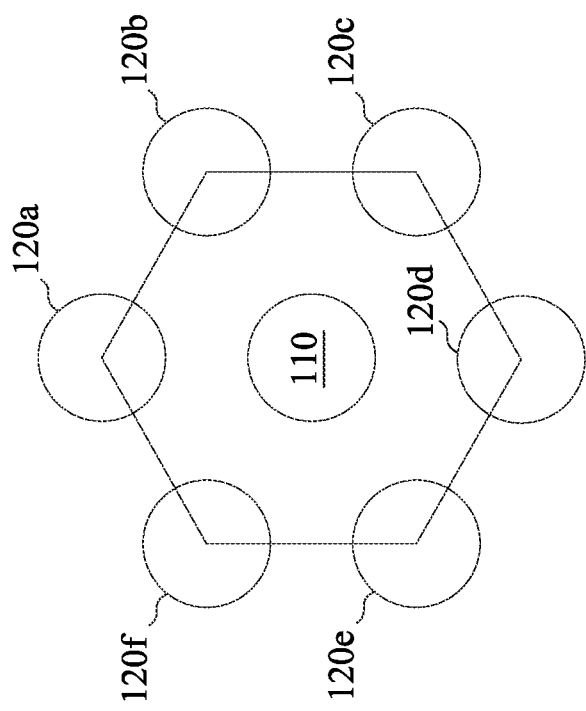
FIG. 1
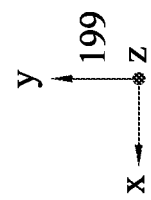

| Concentric | 1 | 2 | 3 | 4 | 5 |
|---|---|---|---|---|---|
| Via num | 1 | 7 | 19 | 37 | 61 |
| Metal area | 170 | 1800 | 5000 | 10000 | 17000 |
| Metal density | 1% | 10.5% | 30% | 59.3% | 98.6% |
| Via / metal | 90% | 70% | 58% | 57% | 56% |

FIG. 3

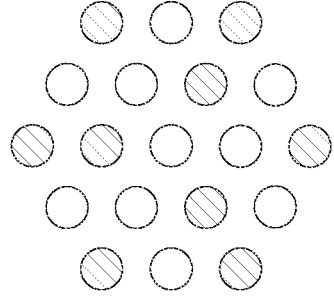
FIG. 4d
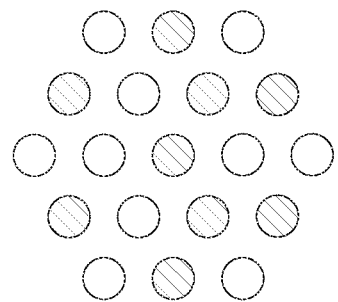
FIG. 4f
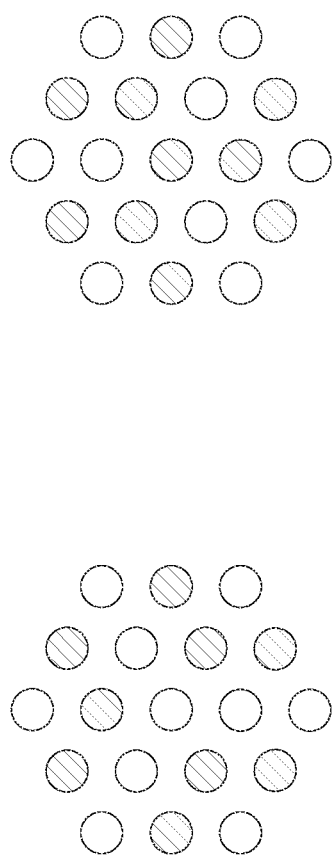
FIG. 4c
FIG. 4e
FIG. 4b

POWER DELIVERY STRUCTURES AND METHODS OF MANUFACTURING THEREOF

BACKGROUND

Semiconductor devices are ubiquitous in several applications and devices throughout various industries. For example, consumer electronics devices such as personal computers, cellular telephones, and wearable devices may contain several semiconductor devices. Similarly, industrial products such as instruments, vehicles, and automation systems frequently comprise a large number of semiconductor devices. As semiconductor manufacturing improves, semiconductors continue to be used in new applications which, in turn, leads to increasing demands of semiconductor performance, cost, reliability, etc.

These semiconductor devices are fabricated by a combination of front-end-of-line (FEOL) processes and back-end-of-line (BEOL) processes, which connect one or more semiconductor (e.g., silicon) dies (also referred to herein as "chips") to each other and package them into a semiconductor device that can interface with other devices. For example, the package may combine a plurality of semiconductor dies and can be configured to be attached to a printed circuit board or other interconnected substrate, which may, in turn, increase the thermal and connection density of a semiconductor device.

Many BEOL operations comprise processing a semiconductor or related device by alternatively depositing and etching levels of the device, one disposed over the other. Processes may interconnect levels by a redistribution structures, vias, bonding wires, etc. in order to propagate signals within a semiconductor device, and between a semiconductor device and a substrate, connections (e.g., electrical, thermal, mechanical, etc.) are formed between levels of semiconductor devices. While existing approaches use sophisticated techniques, further improvements are needed to advance the state of the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a hexagonal via structure, in accordance with some embodiments.

FIG. 3 illustrates a selection matrix for patterns of various number of concentric hexagons.

FIGS. 4a, 4b, 4c, 4d, 4e, and 4f illustrate a plurality of patterns for a concentric hexagonal connection structure having three concentric hexagons, in accordance with some embodiments.

DETAILED DESCRIPTION

Figure 2B:
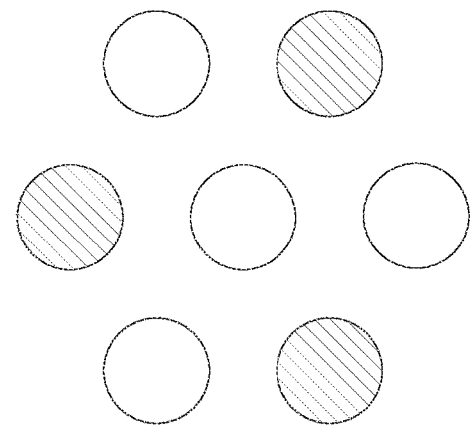
FIGS. 2a, 2b, 2c, and 2d illustrate a plurality of patterns for a concentric hexagonal connection structure having two concentric hexagons, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are redistribution structures including connection trees and methods for their design. These redistribution structures provide connectivity through a plurality of levels of a semiconductor device. For example, the plurality of levels of the semiconductor device may be disposed between a connector of a semiconductor die and a connector of a semiconductor package. The connection trees may include one or more connections, between one or more connectors of the semiconductor die and the connectors of the semiconductor package. The connection trees may have various properties, such as impedances associated therewith. For example, various connection trees may include one or more resistance profiles which may be referred to as a thickness of the connection trees. For example, a plurality of connection trees can have a plurality of associated thicknesses, and each thickness may be associated with one or more connection structures. The connection structures may be a pattern of vias and conductive pads corresponding to each of the predefined thicknesses of the connection tree. For example the patterns may be concentric geometric patterns (e.g., hexagonal patterns) wherein thicker connections are realized by additional concentric rings of vias and thinner connections are be realized by thinner concentric rings of vias. Alternatively or in addition, the thickness may be varied according to a number of vias in a pattern which are populated or depopulated. The vias may be electrically connected by conductive elements such as power and ground planes connecting to or including the conductive pads. The planes may be defined based on the placement of the connection structures.

Advantageously, the placement of the conductive elements (e.g., power planes) based on the vias may reduce excess area and metal density of the conductive elements. For example, the increase of an overlap of planes between the various layers (which are also referred to herein as levels) of the redistribution structures of the semiconductor device may be omitted except where vias are located. Moreover, the lateral distance between vias may be minimized such that the lateral distance between two vias on adjacent layers of the semiconductor device may be reduced, relative to two vias having a greater lateral distance therebetween. This may reduce impedance associated with a connection. Moreover, the association of the die connectors and package connectors may further reduce lateral flows in a device (e.g., by providing a low resistance path for each stem of the connection tree, which may minimize cross branch current flow).

Semiconductor devices may include connections between one or more components thereof. For example, the semiconductor devices may include one or more semiconductor chips having one or more connections, and one or more package terminals having one or more connections. For example, a semiconductor can include a processing semiconductor die, a memory semiconductor die, a package terminal such as a ball grid array (BGA) bump, controlled collapse chip connection (C4), etc. Various signals, such as clocks, data and address buses, and power and ground signals may be connected between the semiconductor dies and the package terminals. The semiconductor devices may include various device features such as gates, fins, isolation trenches, etc. which may form processors, analog devices, filters, memory areas, etc.

The semiconductor device can include a power deliver/distribution network (PDN) including power and ground signals. The power and ground signals can pass between the semiconductor dies and the package terminals via redistribution structures. In some embodiments, a silicon die may be connected to one or more C4 connectors providing a thermal, electrical, and mechanical connection between the silicon die, and a first layer (e.g., PM0) of a semiconductor device, and connect through a plurality of layers of the semiconductor device (e.g., PM1, PM2, and PM3) to a package terminal through one or more under-ball metallurgy patterns (UBM). Various semiconductor devices may include additional, or different connectors, layers, signals, redistribution structures, etc. For example, signals can pass through various additional connectors such as bond wires, pin-grid array pins, or additional substrates.

Redistribution structures can include one or more connection trees having one or more vias which can be arranged in various patterns. For example, a pattern can be predefined according to a desired cross sectional area, resistance, inductance, metal density, etc. Redistribution structures may be defined according to one or more design rule checks of a process (DRC). For example, a maximum and minimum metal density, a minimum via to via pitch (e.g., of the same layer of the semiconductor device or between adjacent or non-adjacent levels of the semiconductor device) may vary according to a process.

The vias of the redistribution structures may extend between layers of the semiconductor devices, and may be connected (e.g., thermally, mechanically, or electrically) by one or more conductive structures such as power and ground planes. For example, a layer of the redistribution structure may contain one or more power or ground planes (e.g., the layer may be a redistribution layer (RDL)). The power or ground planes may be continuous or discontinuous. For example, a layer of the semiconductor device may include two ground planes which are electrically connected only on another layer of the semiconductor device. For example, the segmentation may be to enable routing of other signals, to create a subnet of the voltage (e.g., to improve signal integrity), to reduce metal density, etc. A target metal density or target range of metal densities may improve manufacturability by ensuring a planarity of surfaces, avoiding stress by metal expansion/contraction cycles, etc.

FIG. 1 illustrates a pattern of two concentric hexagons. An (innermost) first hexagonal pattern 110 is depicted surrounded by a second concentric hexagonal pattern 120 of via structures having six via structures, 120*a-f*. The depicted hexagonal patterns is denser that a tetragonal or pentagonal pattern, having a similar distance between the via structure of the first pattern 110 and the via structures of the second pattern 120. Although the figures are not intended to depict any particular scale, for a fixed distance between concentric patterns, a heptagonal pattern, octagonal pattern, etc. may not maintain the via to via spacing in the second or subsequent levels, thus for some embodiments, the hexagonal pattern maximizes footprint density, and may thus also maximize the number of connections between levels of a semiconductor device through via structures populating the footprint.

The depicted structures are disposed along an X-Y plane, as indicated by the axis 199. The disposition of various elements thereupon may be referred to a lateral disposition. Such lateral disposition is without regard to a location along a z-axis. For example, the various via structures of the hexagonal pattern of FIG. 1 may be disposed in various levels of a device (i.e., distributed along a z-axis of the device). The lateral relationship between such vias describes only their position within X-Y planes. The via structures may comprise vias traversing between two levels of a semiconductor device, a through silicon/substrate vias (TSVs) traversing a silicon chip or other substrate, Through-Interlayer-Via or Through-InFO-Via (TIV) traversing a plurality of levels of a semiconductor device, or other methods of electrically connecting various levels of a semiconductor device.

Any number of additional hexagonal or other patterns may surround the depicted embodiment, or otherwise be comprised within the depicted pattern. In some embodiments, the depicted pattern may be laterally surrounded by two additional concentric hexagonal patterns. Additional hexagonal patterns may be added, which may maintain similar spacing and include a difference of six via structures in each hexagonal pattern. For example, some embodiments include a third concentric hexagonal pattern of via structures having twelve via structures, and a fourth concentric hexagonal pattern of via structures having eighteen via structures, so that the hexagonal pattern includes thirty seven via structures. Further embodiments may comprise a fifth hexagonal pattern having twenty-four via structures, and so on, or may comprise larger, smaller, or different patterns.

Some embodiments may not populate every position within the pattern with a via structure. For example, via structure 120*e* may be left unpopulated (e.g., if the via would interfere with a keep-out zone), and the other six via structures may be populated. For the sake of clarity, the "footprint" or "conductive pad" describes a portion of the conductive structure configured to receive the via structure. The pattern may include a location of such a footprint within the pattern. In many embodiments a footprint to receive a via structure may be present at a pattern location, however, a pattern location does not require any such footprint or other tangible properties. For example, in one embodiment, an arbitrary pattern may comprise a pattern extending outside of a semiconductor device. Some pattern locations may comprise no footprint, no surrounding dielectric, etc. (i.e., may not exist in a tangible form). For example, if via structure 120e was unpopulated, and the remaining depicted vias remained, such an embodiment may herein be referred to as a pattern comprising seven locations for via structures, with six such locations populated with respective footprints for via structures. A footprint may be populated along one, two, or more surfaces. For example, a stacked via may populate a footprint on two surface, whereas a laterally offset via (e.g., having a minimum pitch between adjacent layers) may populate a footprint on one surface.

Some embodiments include only a subset of footprints. For example, some embodiments may populate only an innermost footprint, leaving a substantial dielectric space between adjacent patterns (e.g., to avoid undesired capacitive coupling with adjacent patterns). Some connection structures populate about half of the footprints with a via structure in a first layer of a device, and connect about half of the footprints with a via structure in a second layer of the semiconductor device in order to maximize the connections between two layers of the semiconductor device. Such embodiments may, advantageously, maximize the potential connections between each of the layers of the device. Referring now to FIG. 2a, one illustrative example is disclosed.

The depicted pattern is comprised of two concentric hexagonal patterns, an innermost first pattern 210, and a second pattern 220 laterally surrounding the first pattern 210. The second concentric hexagonal pattern comprises a plurality of footprints, 210, 220b, 220d, and 220f, as well as a second plurality of footprints, 220a, 220c, and 220e. The first plurality of footprints may be populated with via structures impregnated within a first layer of a semiconductor device, and the second plurality of footprints may be populated with via structures impregnated within a second layer of the semiconductor device (e.g., within a dielectric body). A conductive structure 230 joins the first plurality of via structures to the second plurality of via structures (e.g., electrically, thermally, mechanically, etc.). The conductive structure 230 comprises a plurality of footprints (not depicted) configured to receive via structures which are interconnected by conductive traces or planes. The footprints may be larger in lateral size than the via structures, which, advantageously, may allow the footprints to receive vias which are misaligned with the footprints, and increase overall metallization in certain embodiments. Alternatively, or in addition, the conductive structure may comprise footprints which are smaller than the via structures which may minimize a metallization percentage in certain embodiments, or to allow for larger traces, (e.g., to reduce resistance). For example the footprints may be of the same dimension of the conductive traces they join. Some embodiments may comprise footprints about the same size as the vias they are configured to receive, which may balance the metal content of the footprints with the ability to receive slightly misaligned vias.

The conductive structure comprises a plurality of connections between footprints and any connected via structures. For example, each depicted via structure of the first plurality of via structures is connected to at least two via structures of the second plurality of via structures. Subdivisions of the pattern may also be considered. For example, the triangular portion of FIG. 2a formed by the first pattern 210, and via structures/footprints 220a, and 220b comprise two via structures from one layer of the semiconductor device, and one via structure from another layer of the semiconductor device. Further, the triangular portion comprises two inter-layer connections (the depicted connection between the first pattern 210 and via structure 220a, and the depicted connection between via structure 220a and via structure 220b). Indeed, every triangular selection of the via structures of FIG. 2a has similar properties. The two inter-layer connections of any such portion of the depicted pattern, in combination with the depicted conductive structure may, beneficially, maximize the connections between layers (e.g., minimize transmission losses) for power delivery, or delivery of various other signals, relative to other connection structures which may comprise fewer inter-layer connections, or which may comprise less regularly repeating patterns (embodiments of which disadvantageously, may lead to hot spots, poor signal integrity, etc. in particular semiconductor devices and applications, but which may also have associated advantages). The conductive structures may collectively be referred to as a plane wherein the conductive structures are of a same net across an area. The plane may be discontinuous, as depicted, or continuous wherein the conductive structures are of greater dimension in the X-Y plane than the pitch between the conductive pads.

Figure 2D:
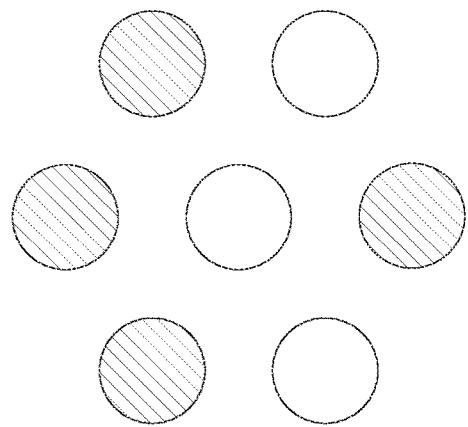
Figure 2A:
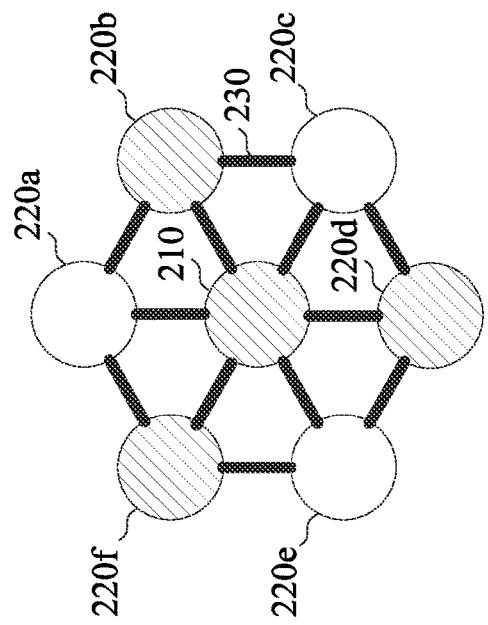

FIG. 2b depicts a similar pattern as FIG. 2a, where the patterns for the via structures of the first layer of the semiconductor device, and the second layer of the semiconductor device are inverted. Because the first layer and second layer of the semiconductor device are intended to be arbitrary, without reference to the steps of various operations, or the disposition of the connection structure in free space, FIGS. 2a, and 2b may refer to the same pattern according to two different descriptions, or may refer to two different patterns. Although not depicted, a conductive structure 230 of FIG. 2b may be similar to the conductive structure 230 of FIG. 2a. Alternatively, the connection structure of 2a may vary from the depicted connection structure. For example, the various connections may be thinner or thicker (e.g., in a lateral direction, or along the z-plane), and may be of uniform dimension or non-uniform dimension. In one embodiment, a conductive trace may gradually taper to meet a larger conductive footprint (e.g., to avoid signal reflections, manufacturing issues such as over-etching, etc.).

Figure 2C:
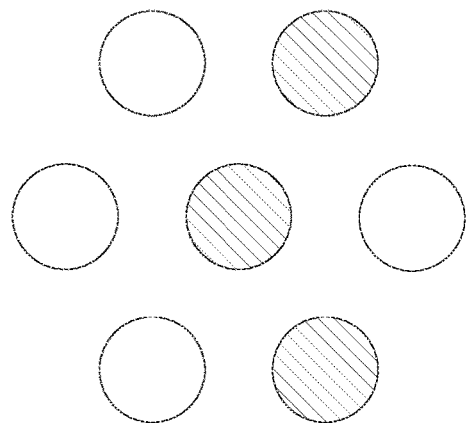

FIGS. 2c and 2d refer to another paired set of descriptions of patterns which may refer to the same pattern according to two different descriptions, or may refer to two different patterns. Although alternate embodiments may exist, the depicted FIGS. 2a-2d are each configured to dispose about half of the via structures on separate layers of a device, and wherein any triangle of adjacent via structures comprises at least two inter-layer connections. Thus every via structure is connected to a layer of the semiconductor device by at least two traces. Some embodiments may be disposed within devices other than semiconductor device, for example, within various non-semiconductor interposers or substrates.

Referring now to FIG. 3, a plurality of concentric hexagonal patterns are considered, ranging from a single via pattern to a pattern of five concentric hexagons. Selected approximated attributes of each device are displayed in summary table 300. As shown in column one of the table 300, the single via has a relatively low density (about 1%), and a the via comprises most of the metal in the connective structure (about 90%), since only a single footprint and no traces are needed to receive the via. A connection structure, for example, the connective structure disclosed in FIG. 2a, disclosed by column two substantially increases density, though metallization increases non-linearly, to account for the addition of conductive traces needed to join the various vias. Via count is further increased with a third concentric hexagon, along with a coincident increase in metal density. Via count and metal density continue to increase with a fourth and fifth concentric hexagon.

If a maximum metal density of about 100% is desired, a pattern of five concentric hexagons may be selected. If a lower or higher metal density is desired, a different shape may be selected. For example, if a metal density between about 50% and 70% is desired, a pattern of four concentric hexagons may be selected. As one skilled in the art will understand, particular numbers will vary according to the size, composition, and geometry of via structures, footprints, traces, etc. Further, various design rules may affect the selected geometry. Thus although a structure of 4 concentric hexagonal patterns maximizes density for one embodiment, other geometries or design rules may result in patterns of different shapes, numbers of patterns, etc. For example, embodiments having conductive elements forming a continuous plane may result in a higher metallization that embodiments having discontinuous planes.

Figure 4A:
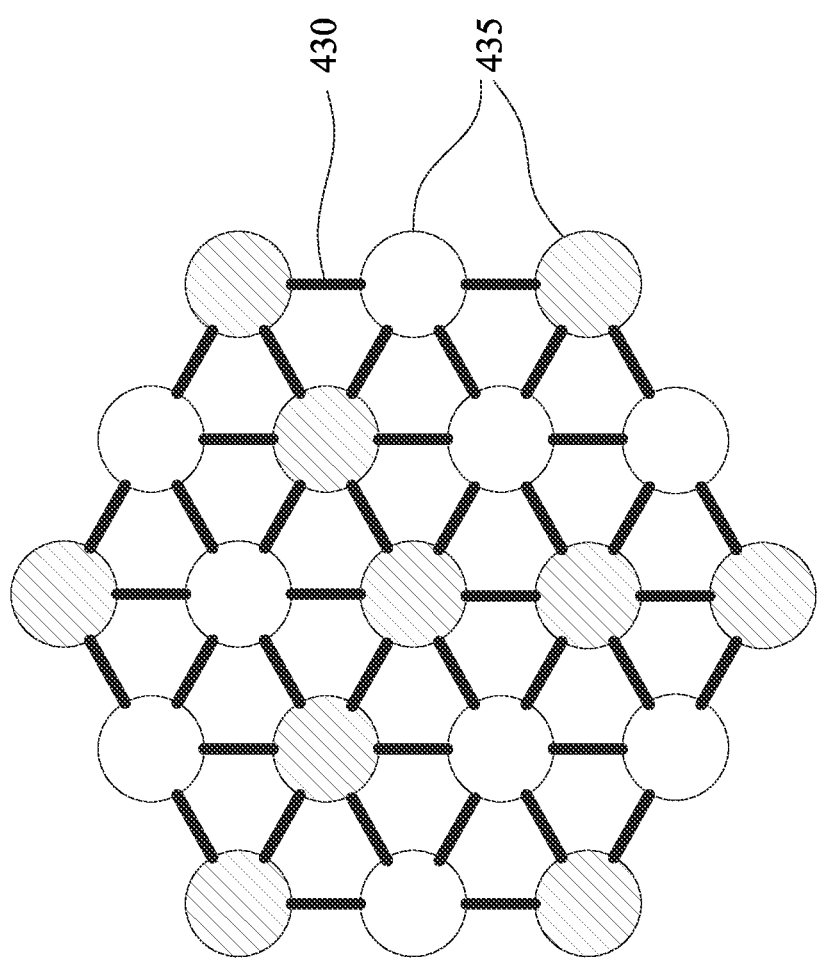
Figure 5A:
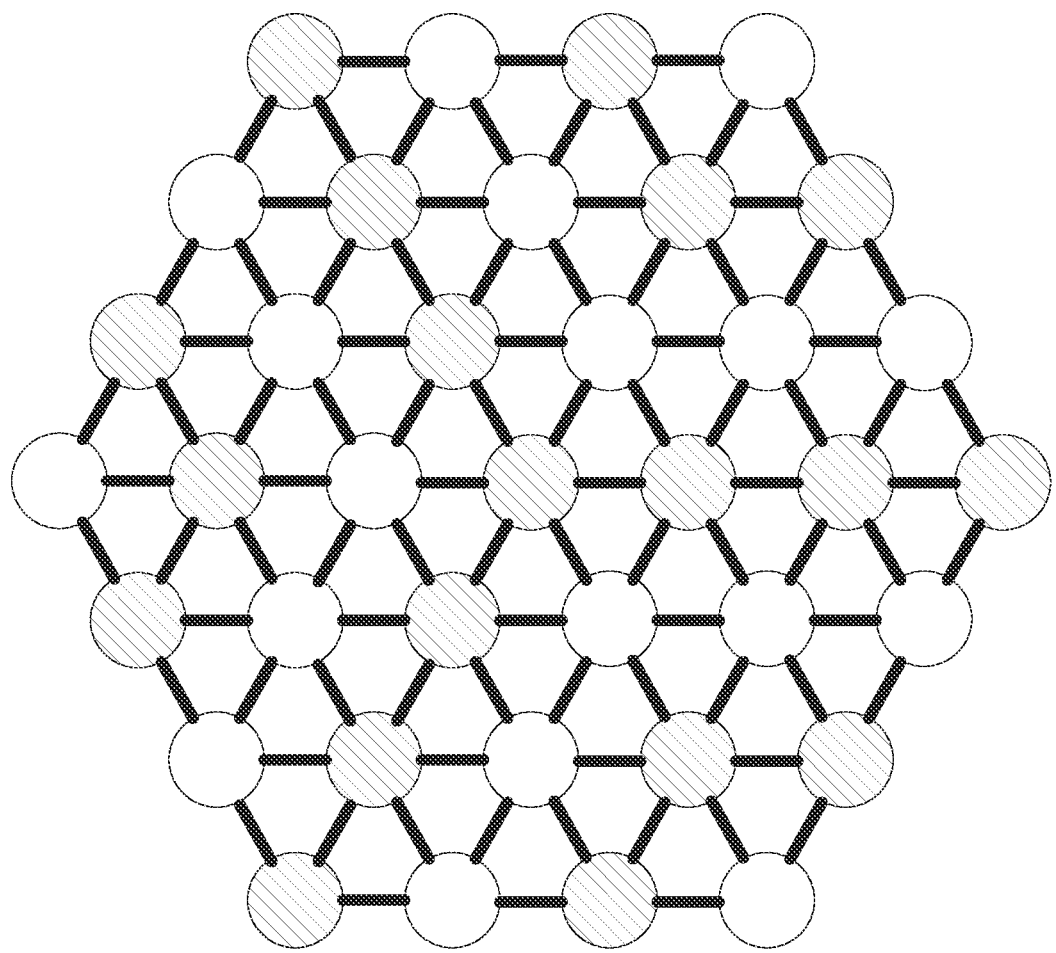
FIGS. 5a, 5b, 5c, 5d, 5e, 5f, 5g, and 5h illustrate a plurality of patterns for a concentric hexagonal connection structure having four concentric hexagons, in accordance with some embodiments.
Figure 5D:
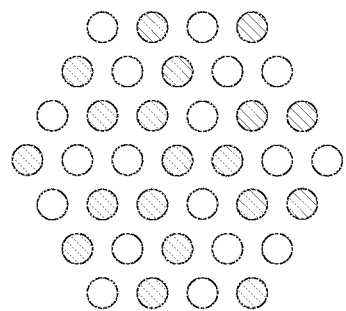
Figure 5C:
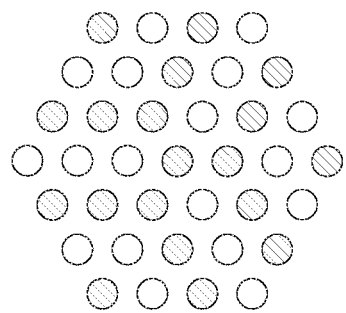
Figure 5B:
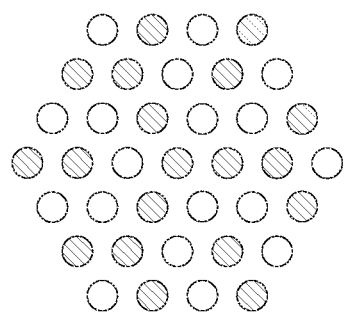
Figure 5H:
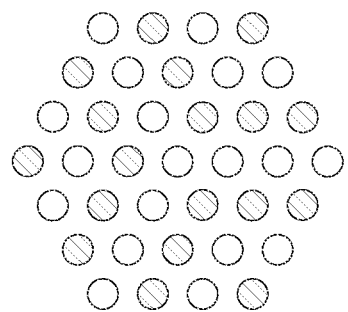
Figure 5G:
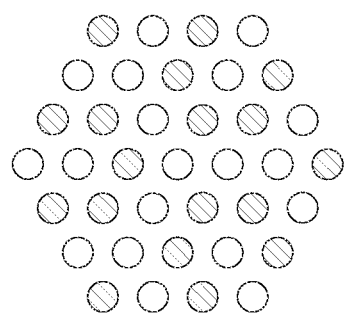
Figure 5F:
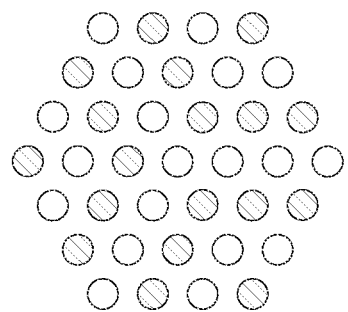
Figure 5E:
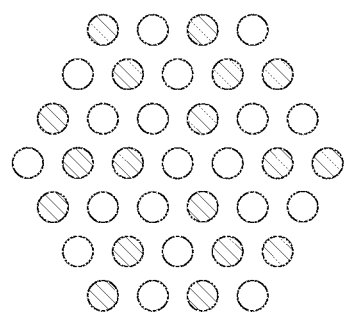

Referring now to FIGS. 4a-4f, a plurality of hexagonal patterns of three concentric hexagons is depicted. Like the patterns of FIGS. 2a-2b, the hexagonal patterns are disposed across two layers of a semiconductor device, with the plurality of first via structures disposed in the first layer shown darkly shaded, and the plurality of second via structures disposed in the second layer shown lightly shaded. Referring specifically to FIG. 4a, a disclosed pattern is similar to the pattern of FIG. 2a, comprising an additional third hexagonal pattern 435 of via structures. A connection structure 430 joins each of the via structures according to a similar pattern as FIG. 2a, where each via is connected to two vias of another layer. Such a pattern may enable a maximum number of connections between layers of a semiconductor device, (e.g., adjacent layers where the via structures are convention via structures extending between two layers of a semiconductor device). Referring now to FIGS. 4b-4f, additional patterns are disclosed which may be populated with via structures, and joined with conductive structures, such as the conductive structure depicted in FIG. 4a, to form connection structures to join a maximum number of via structures between layers of a semiconductor device.

Referring now to FIGS. 5a-5h, a plurality of hexagonal patterns of four concentric hexagons is depicted. Like the patterns of FIGS. 4a-4f, the hexagonal patterns are disposed across two layers of a semiconductor device, with the plurality of first via structures disposed in the first layer shown darkly shaded, and the plurality of second via structures disposed in the second layer shown lightly shaded. The first and second pluralities of vias are shown connected by a conductive structure disposed between the first and second pluralities of via structures in FIG. 4a. Other connection structures may comprise similar conductive structures joining via structures. As illustrated, each concentric layer of hexagons comprises an alternating pattern of via structures between layers of a semiconductor device, so that beginning with one via structure of a concentric hexagonal pattern, and advancing, clockwise or counter-clockwise, every other via will be disposed on the same layer (except the first, innermost hexagon, having a single via structure).

Additional pluralities of via structures may be disposed on, along, or in additional semiconductor layers. For example, a third plurality of via structures may be disposed on a third layer of the semiconductor device, and may connect to the plurality of second via structures through a second conductive structure. The third via structures may be similar to the first plurality of via structures, (and such an alternate repetition of layers may continue through a plurality of fourth, fifth, and sixth via structures) which may each be joined by a respective additional conductive structure such as a plane. Alternatively or in addition, some connection structures may extend through several layers of a semiconductor device without alternating between two patterns of populated footprints. For example, they may comprise additional patterns, such as those depicted by FIGS. 5b-5g, may comprise additional or fewer concentric hexagonal patterns, or may comprise different connections entirely, such as TSVs, bond wires, C4 bumps, etc. In some embodiments, less than half of the pattern locations of a concentric hexagonal pattern may be populated. For example, about a third, or about a quarter may be populated. For example, if a plurality of layers each comprise a plurality of via structures, the pluralities extending above/below a power plane or redistribution layer may contain fewer (or more) populated via structures. The unpopulated via structures may be distributed throughout the pattern, limited to particular (e.g., outermost) concentric patterns, or otherwise selected.

Referring now to FIGS. 6a-6e, cross sectional views of intermediate stages in the layout of a connection structure of a semiconductor device 600, in accordance with some embodiments are disclosed. The layout of the connection structures does not imply a sequence or method of manufacture. Indeed, the layout of the semiconductor device 600 may comprise mapping various nets of a netlist of a logical design to a physical location of the semiconductor device 600. The layout may include iterative steps, such as to modify the design, such that the logical layout operations may be completed prior to, or incident to generating a manufacturing design prior to at least some manufacturing operations of a fabrication process.

Figure 6A:
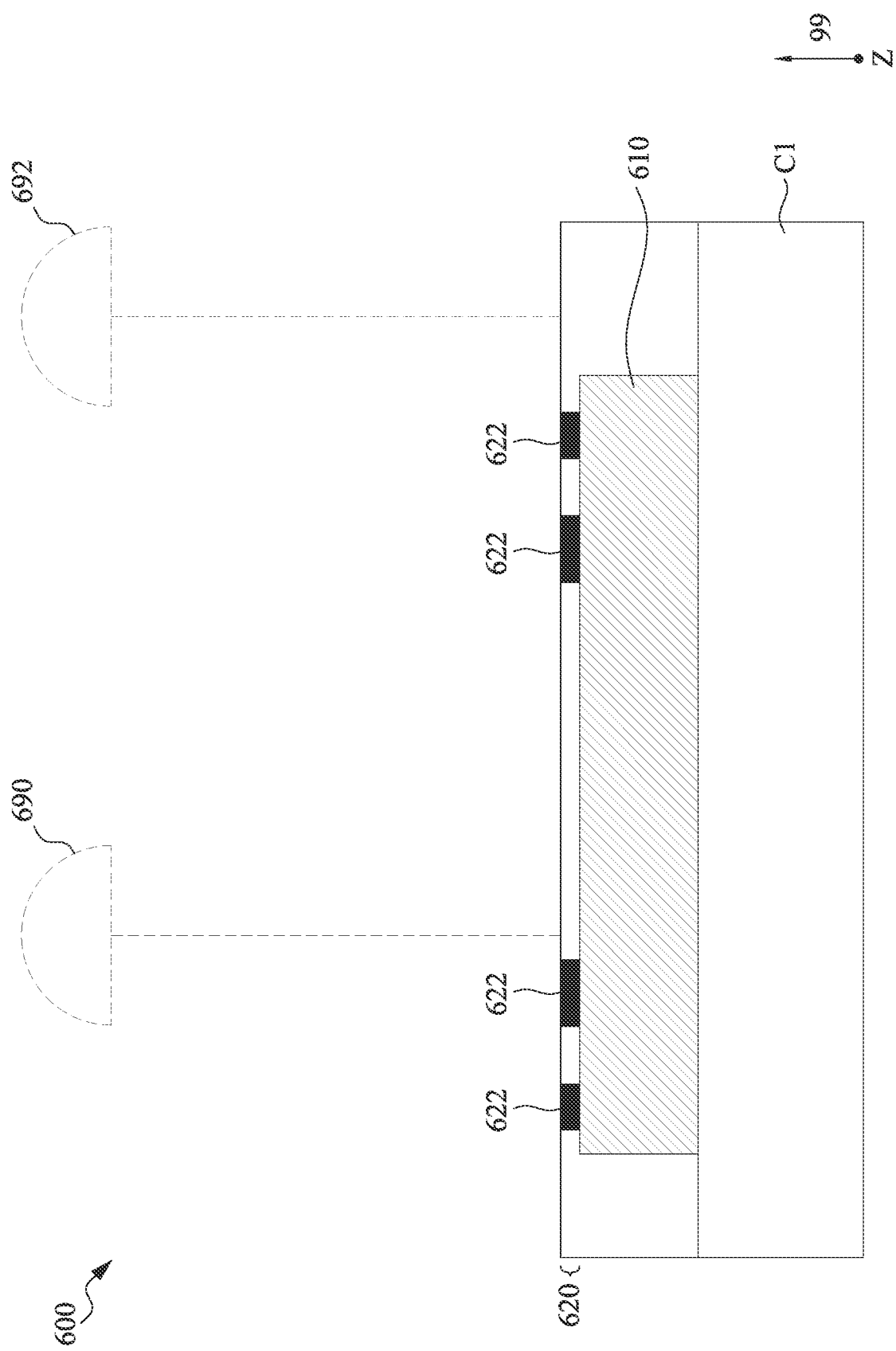
FIGS. 6a, 6b, 6c, 6d, and 6e illustrate cross sectional views of intermediate stages in the formation of a semiconductor device, in accordance with some embodiments.

FIG. 6a depicts a cross sectional view wherein a cross section of the semiconductor device 600 is labeled with a positive z-axis 99 in the upwards direction. The z-axis 99 is intended merely to describe the figures herein and is not intended to be limiting with regard to the semiconductor device 600. For example, the direction of the semiconductor device 600 may be inverted, as to adhere the semiconductor device 600 to a printed circuit board (PCB).

A carrier substrate C1 is provided. The carrier substrate C1 may be glass, ceramic, a polymer based material, or a combination of materials. For example, a de-bonding layer such as a light-to-heat conversion release layer may be deposited over a Borosilicate glass body, which may, advantageously, enable the carrier substrate C1 to be removed from temporarily coupled layers while minimizing thermal expansion and contractions. A semiconductor die 610, is placed over the carrier C1. The semiconductor (e.g., silicon) die 610 may comprise processing functions, I/O functions, memory, R/F and analog processing functions such as filtering, etc. The various functions of the semiconductor die may be associated with power and signals which may include a number of connections and the properties thereof. An encapsulant may surround the semiconductor die 610.

A first layer 620 is defined over the semiconductor die. The first layer 620 and additional layers depicted herein may be the metallization layers of a semiconductor device 600 which can interconnect the one or more semiconductor dies, and connect the semiconductor die to other die features or portions. For example, the connections can join PDN, data, clock, address signals, etc. The first layer includes die terminals 622 which may be configured to attach to the semiconductor die 610 to pass signals including power and ground signals. For example, the die terminals 622 may be C4 bumps, die pads, etc. The terminals are disposed within a dielectric material such as a silicon oxide layer, a silicon nitride layer, a silicon oxy-nitride layer, or a dielectric layer formed by other suitable dielectric materials. The dielectric material may be the encapsulant surrounding the semiconductor die 610, or may be configured to interface with said encapsulant. The semiconductor device 600 may include an interstitial layer (e.g., a hard mask) between these or other materials. The material of various conductors, dielectrics, encapsulants, etc. may be defined prior to, during, or subsequent to the layout of the device. For example, a process may define a material type, or may define a plurality of possible material types. A material can be selected based on an achieved density, separation, etc. (e.g., in order to meet a required capacitance, impedance, etc.) For example, the material selection may be performed as an iterative process with the layout (e.g., a first iteration may target a first material such as an aluminum containing conductor, and if such a layout cannot meet DRC, a second iteration may target a second material such as silver). Various dielectric and similar materials may be determined during or following the layout, or be predefined based on the process.

A location of additional connectors is identified based on a projected location for a z-height above the semiconductor device. In some embodiments, additional connectors may be semiconductor package terminals, terminals of another die, an integrated passive device (IPD) or another connector. In some embodiments, the location of the additional connectors can be identified based on signal parameters, such as a desired lateral distance between various connectors, a total path resistance for a signal, or another impedance constraint. In some embodiments, the connector locations may be defined based on a standard connector location of a semiconductor package such as a QFN, or PGA, or BGA Device. The location may be or include intermediate connectors. For example, the identified location may be or include a location of a UBM for a BGA bump. The additional connectors may be configured for electrical connection to the silicon die or the another connectors. For example, a first additional connector may be a VSS package terminal 690, and a second additional connector may be a VCC package terminal 692. The position may be or include a center of the connector or a pattern such as a two-dimensional projection of the terminal onto a surface of the semiconductor device 600 (e.g., the first layer 620). In some embodiments, the position of the die terminals 622 is based on identifying the location of the additional connectors. In some embodiments, the die terminals 622 may be based on the location of corresponding circuits on the semiconductor die. In some embodiments, a semiconductor device may include selectable die terminals according to a package or power requirements (e.g., additional terminals may be connected in higher power applications). For example, some die terminals 622 may not be connected or may connect via branches of the connection trees disclosed herein.

The location of the additional connectors can be defined in one or more planes or axes. For example, the location of the additional connectors may include a center point of the each of the additional connectors, a two dimensional projection of the connector over a surface of the semiconductor device 600, or a three dimensional projection of the connector over a surface of the device (e.g., wherein the surface of the semiconductor device 600 includes non-planar surfaces). A number or a thickness of the layers of the semiconductor device 600 may be based on the z-height of the additional connectors. Another dimension such as a location along a surface of the semiconductor device 600 (e.g., an X or Y axis) may also be identified. In some embodiments, the location of the additional connectors is identified based on the identification of a reference marking, such as a reference marking of a substrate. One or more devices can be formed for connection to the additional connectors, wherein the location of the additional connectors is identified based on the reference marking or another identified location (e.g., an edge or feature of the semiconductor device 600) to ensure a connection between at least one portion of the semiconductor device 600, and the additional connectors.

Figure 6B:
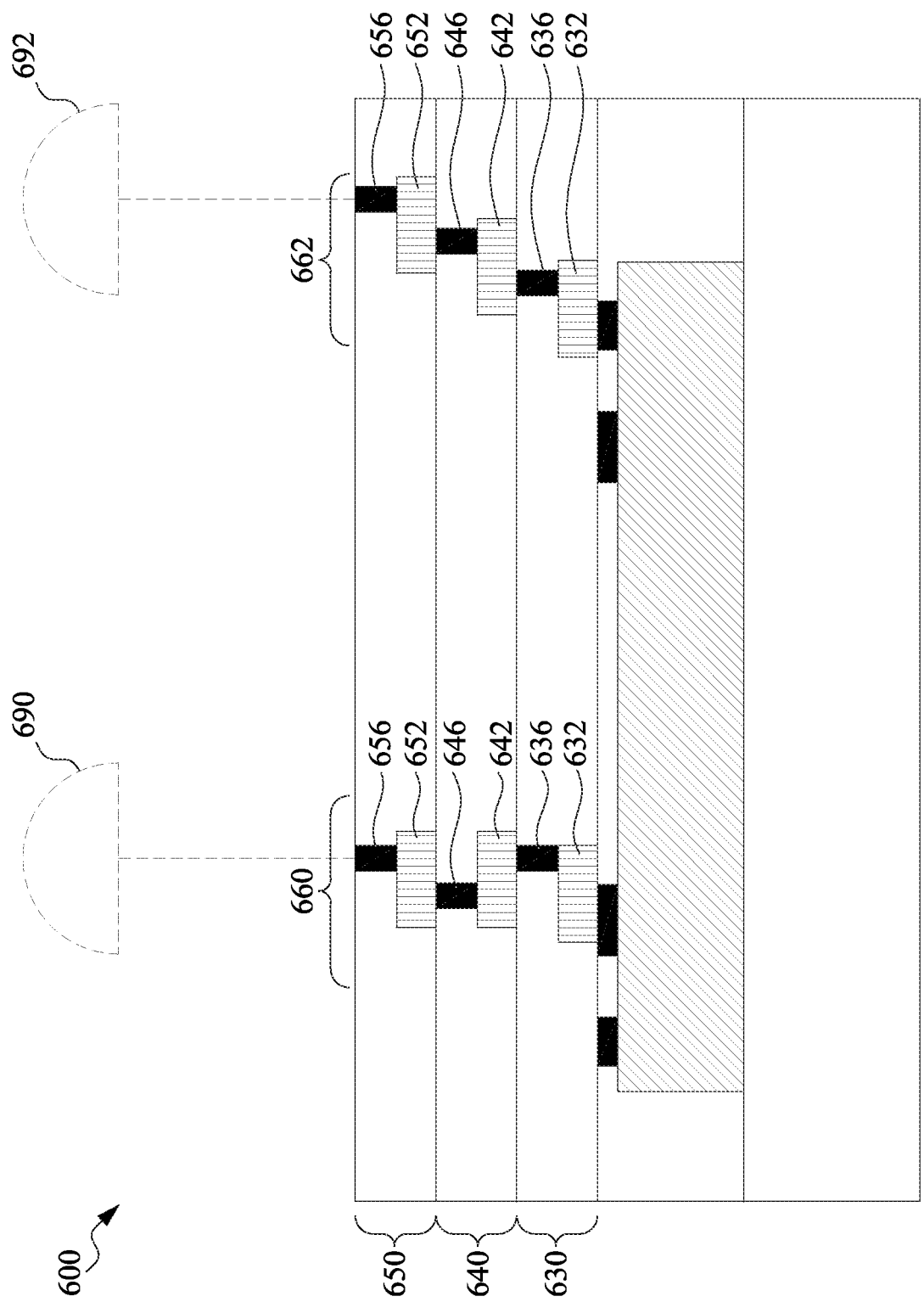

Referring now to FIG. 6*b*, additional layers are defined. Particularly, a second layer 630, a third layer 640, and a fourth, topmost, layer 650 are defined over the first layer 620 in the depicted embodiment. The layers may form a redistribution structure including a plurality of connection trees, the connection trees having conductive pads and planes to connect various via structures thereof to join connectors of the semiconductor device. Various numbers of layers may be defined in various embodiments. For example, layers may be of one or more predefined thicknesses (e.g., z-heights) and a number of layers can be selected to route between the die terminals 622 and the additional connectors (e.g., by the conductive structures) as well as to route additional signals, additional dies, etc. For example, the overall thickness of the semiconductor package may be variable. Alternatively or additionally, the thickness of the layers may be defined according to a current or signal integrity requirement associated with the die terminals 622 or the additional connectors. For example, a high current path may be associated with a low resistance requirement which may result in a layer of increased thickness. The predefined, variable, or fixed layer heights may be associated with a fixed package height. For example, one or more z-heights of layers can be selected to reach a predefined package height. Each topmost layer (e.g., the fourth layer 650) can comprise conductive elements (e.g., UBM) to adhere to the ball. Some additional layers (e.g., the third layer 640) may also contain additional connective elements to connect thereto. For example, a UBM or other interstitial connector may be a three dimensional shape traversing one or more layers (e.g., the third layer 640 and the fourth layer 650).

Each of the additional layers include one or more via structures and one or more conductive elements (e.g., conductive pads). The position of the vias and conductive elements is based on the identified location of the additional connectors. For example, the second layer 630 includes second layer conductive pads 632 configured to connect (e.g., electrically, mechanically, thermally, etc.) with second layer core via structures 636. The third layer 640 includes third layer conductive pads 642 configured to connect (e.g., electrically, mechanically, thermally, etc.) with third layer core via structures 646. The fourth layer 650 includes fourth layer conductive pads 652 configured to connect (e.g., electrically, mechanically, thermally, etc.) with fourth layer core via structures 656. The via structures and conductive pads are placed to connect to the additional connectors. For example, the via structures and conductive elements can be placed to connect to a center or an edge of a connector (e.g., a BGA bump, a UBM, a ground pad, etc.) The placement may be based on a pattern. For example, the one or more via structures can be placed to permit additional connections such as additional connections by via structures in a hexagonal pattern. The hexagonal pattern may be a hexagonal pattern disclosed herein or may be offset therefrom.

The via structures may have a pitch requirement. For example, the via structures may have a maximum and or minimum distance between connected via structures of adjacent planes. The minimum pitch may be based on a manufacturability such as to avoid or minimize overlap between via structures of adjacent layers. The maximum pitch may be defined to minimize lateral current flow, and associated resistance, heat, and signal integrity concerns. A pitch distance and angle may be defined. For example, a pitch may be predefined according to spacing within a pattern. For example, a pitch distance and angle can be based on the patterns of FIGS. 2a-2d, 4a-5h or other patterns (e.g., the pitch distance and angle can be defined to embed the via structures into the patterns). The various connectors may also have a pitch requirements. For example, the pitch requirement of various connectors may be based on a size of one or more connection trees of a redistribution structure disposed between the connectors. Various processes may have various pitch requirements and various patterns. For example, some embodiments may include a pitch requirement of about 150 micrometers for a hexagonal pattern. Another process may be associated with another pitch requirement, such as of about 120 micrometers and a heptagonal pattern.

Each connection between the die terminal 622 and the additional connectors may be a stem of a connection tree. Some stems may include connections to more than one die connector or more than one additional connectors such as a semiconductor package terminal. For example, some connection trees may include multiple stems connecting multiple dies or multiple die connectors from one package terminal connector, or connect multiple package terminal connectors to one die connector. The connections can include intra-semiconductor device 600 connections. For example, connection structures can be formed between various semiconductor dies 610, integrated passive devices, etc. As depicted, a VSS connection structure 660 between an identified location for a VSS package terminal 690 and a die terminal 622 and a VCC connection structure 662 between an identified location for a VCC package terminal 692 and a die terminal 622 is present. Each connector comprises at least one core via structure and conductive pad per layer of the redistribution structure of the semiconductor device 600 the connection tree traverses.

Figure 6C:
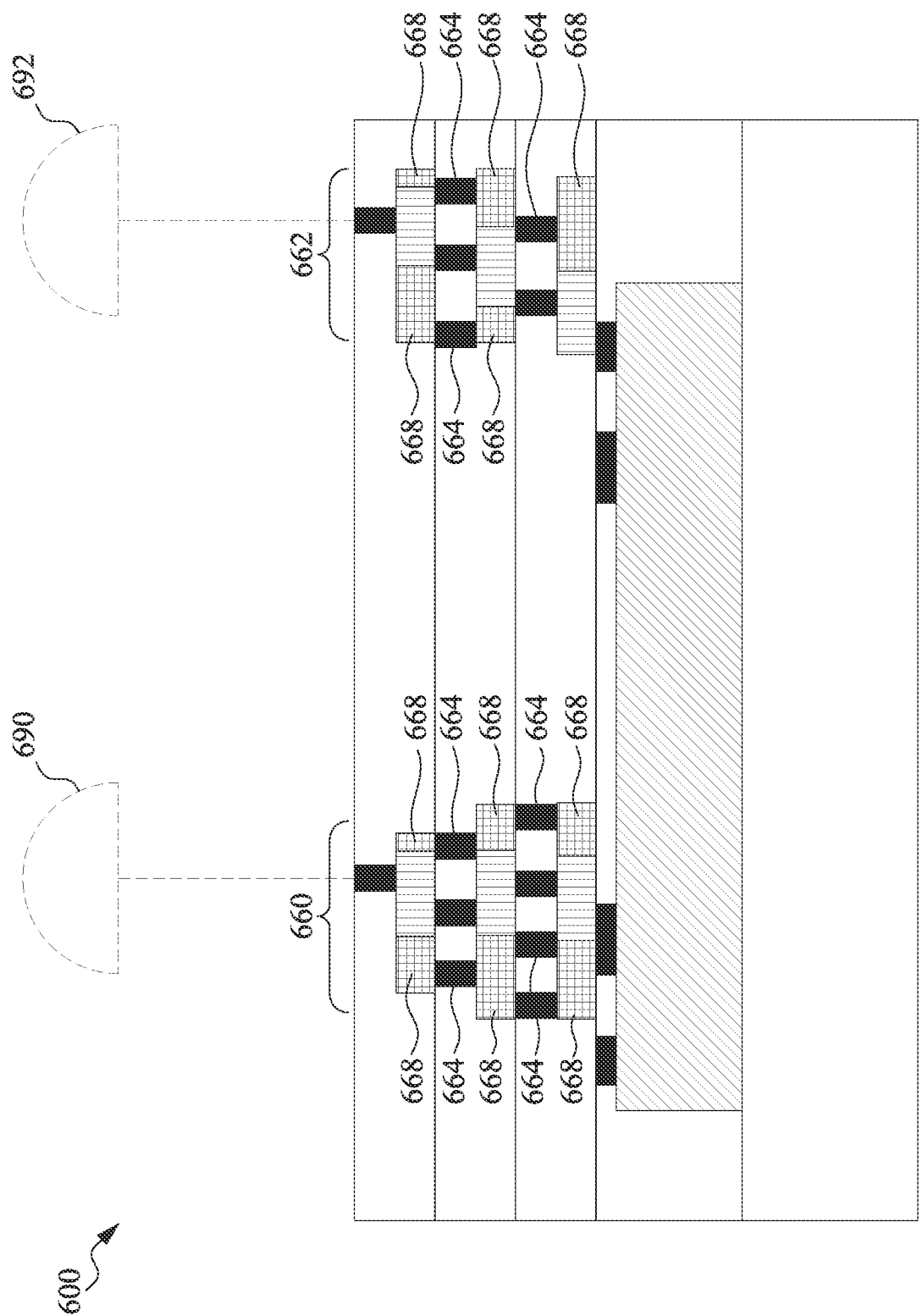

Referring now to FIG. 6c, additional via structures are placed according to a pre-defined pattern. For example, the VSS connection structure 660 and the VCC connection structure 662 can be supplemented with secondary via structures 664 to lower a path impedance, improve signal integrity, reduce redundancy, lower heating effects of currents, avoid interference with nearby elements or otherwise improve signal integrity. The secondary via structures are connected by expanded conductive elements 668 including conductive pads. Said differently, the stems of the VCC and VSS connection trees may be thickened. In some embodiments, the VCC and VSS connection trees may comprise additional die terminals and package terminals. For example, the connection trees may comprise additional stems (e.g., a semiconductor package may include additional VCC, VSS, other PDN, or other non-PDN signals). In some embodiments, branches (e.g., connections between the various stems or n to 1 connection relationships between various terminals or other connectors) may be present which may include branch thickness (e.g., based on a number of via structures, a number or thickness of lateral connections, etc.). Each predefined pattern may be associated with one or more thicknesses. For example, a first thickness may be selected for a 5 milliohm connection requirement, a second thickness may be selected for a 3 milliohm connection requirement, and a third thickness may be selected for a 2 milliohm connection requirement.

The one or more secondary via structures 664 are connected to the expanded conductive elements (e.g., conductive planes or pads). For example, the conductive elements may be a PDN or other plane, such as a ground plane or a power plane. The plane may be a continuous plane or a discontinuous plane having a lattice structure. For example, the conductive pads may be connected by a plane having the connection structure of FIG. 2a, 4a, or 5a. The plane architecture may be predefined (e.g., may be a pre-defined portion of the predefined pattern) or may be determined for a connection structure in situ. For example, a connection architecture may be based on a thickness of a layer, a conductivity of a selected material (e.g., silver, gold, copper, or a highly doped semiconductor).

Figure 6D:
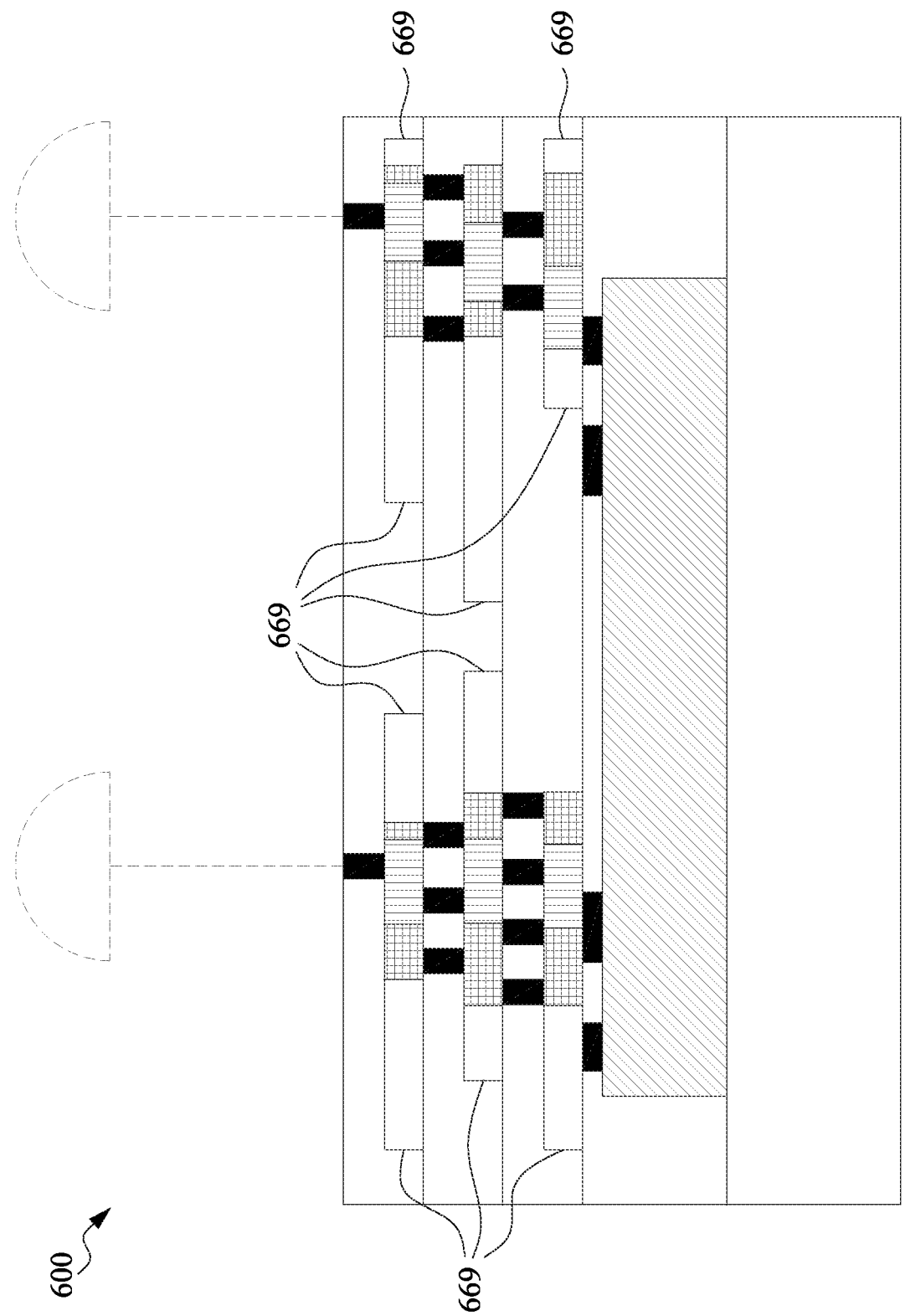

Referring now to FIG. 6d, the planes are adjusted to interconnect and/or conform to DRC. For example, structures or portions of the planes may be alternated between a continuous plane and another planes structure, such as the connection structure of FIG. 2a, 4a, or 5a. The planes can be adjusted to interface with additional portions of the semiconductor device. For example, a plane may be extended to connect to additional terminals of the semiconductor device such as package terminal, die terminals, IPD terminals, etc. The plane may be extended to interface with additional planes, or signals in one or more layers. For example, further plane extensions 669 may extend the planes to join other planes carrying a same signal (e.g., other PDN planes), to guard traces carrying different signals (e.g., data or clock signals), to conform to manufacturing requirements such as plane overlap requirements, metal density requirements, routing requirements, etc.

Figure 6E:
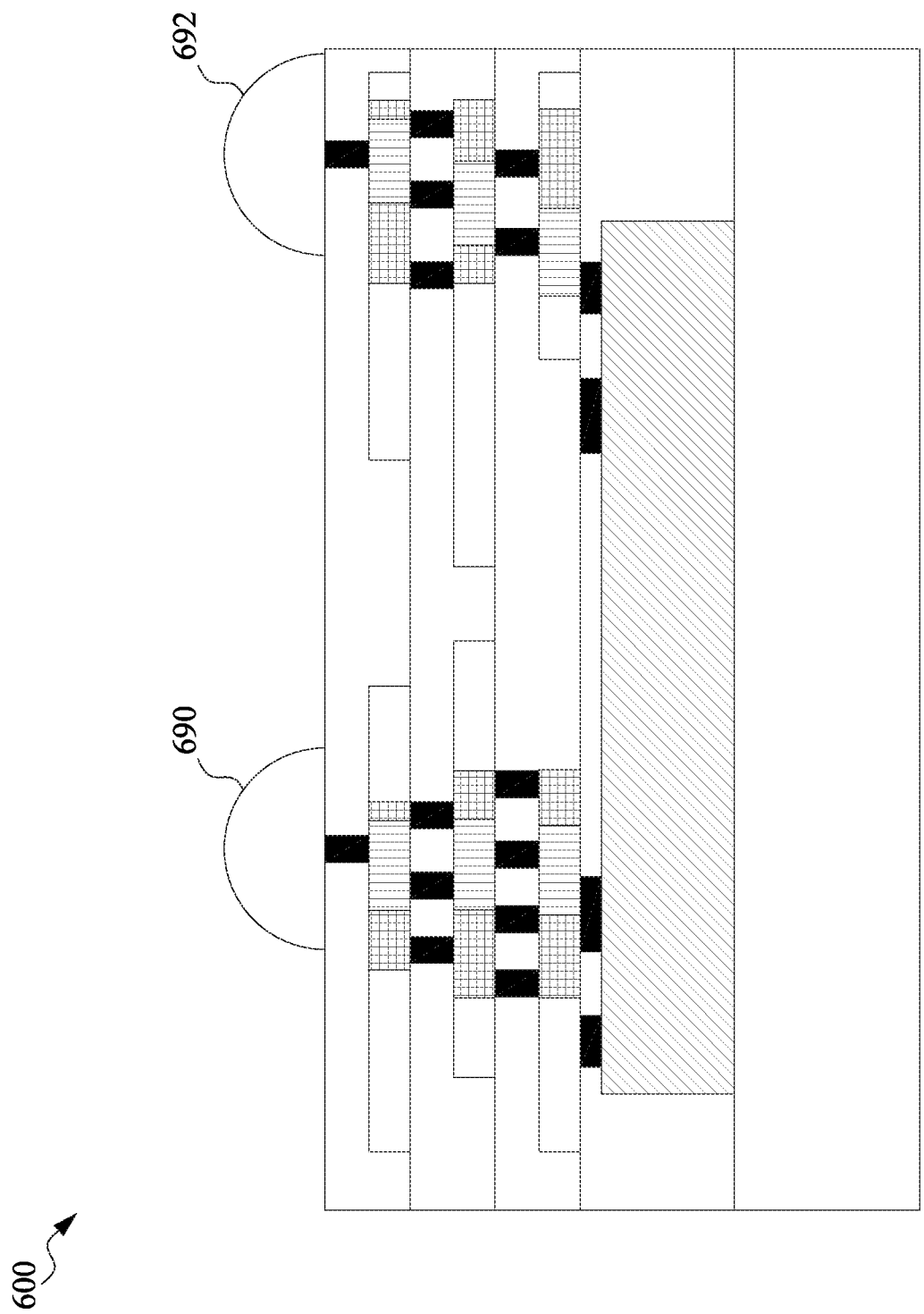

Referring now to FIG. 6e, the surface of the semiconductor device 600 is defined to receive the additional connectors (e.g., the VSS package terminal 690 and the VCC package terminal 692). For example, the surface of the semiconductor device 600 may include one or more intermediate layers to join the via structures or conductive elements. An intermediate layer may be configured to attach to one or more via structures. For example, the intermediate layers can connect to one or more via structures of similar dimension as the additional via structures of the pattern, or to one or more via structures of a different dimension. The via structure may be composed of one or more conductive materials which may be similar or dissimilar to the various additional via structures of the conductive structure. For example, a plurality of via structures may connect to a UBM for the additional connectors.

Figure 7:
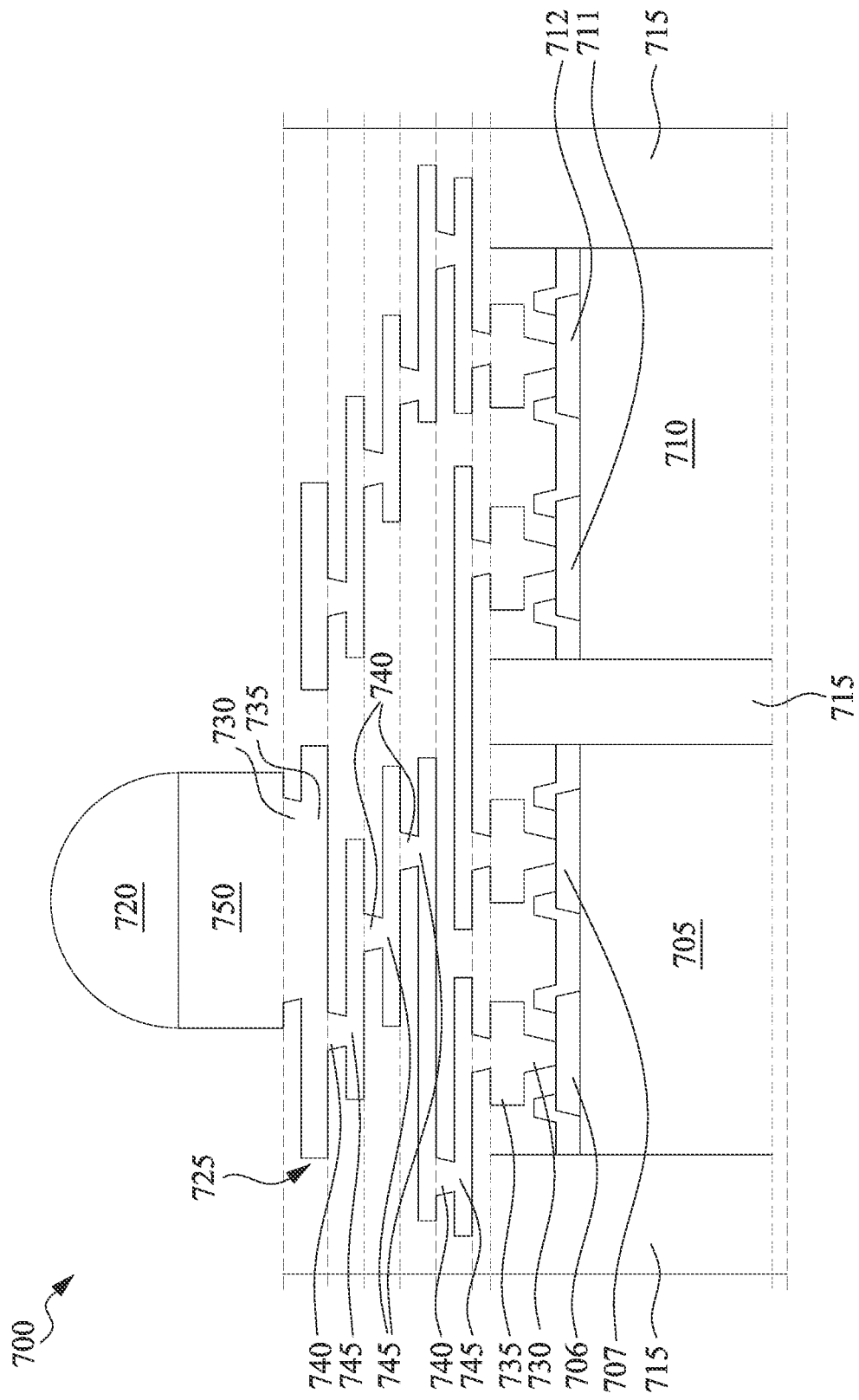
FIG. 7 is a cross sectional view of a semiconductor device, in accordance with some embodiments.

FIG. 7 depicts another cross sectional view of a semiconductor device 700. The semiconductor device 700 includes a first semiconductor die 705 and a second semiconductor die 710. The dies are disposed between layers of encapsulant 715. The semiconductor device contains a plurality of conductive elements (e.g., planes comprising conductive pads for the via structures) and via structures connecting a surface of the first semiconductor die 705 and the second semiconductor die 710 to various connections. For example, the first semiconductor die 705 is connected to a C4 bump 720 by a first die connection terminal 706 and a connection structure 725 (e.g., for a connection to VCC). A second die connection terminal 707 connects the first semiconductor 705 die to a third die connection terminal 711 of the second semiconductor die 710. The connection may connect to an additional connector of the semiconductor device 700. For example, to a ground terminal (not depicted). A fourth die connection terminal 712 may be connected to another terminal or other connector of the semiconductor device 700. For example, the fourth die connection terminal 712 may be connected to VCC or another supply voltage.

The connection structure 725 includes the first die connection terminal 706 connecting to alternating via structures and other conductive elements (e.g., conductive pads) of the connection structure 725. The conductive structures and via structures are of various dimensions. For example, the terminal conducive pads 735 are of a different z-height than the intervening conductive pads 745. Moreover, the terminal via structures 730 are of greater dimension than the intervening via structures 740. Various embodiments may have via structures and terminals of various dimensions. For example, in some embodiments, the connection between the first semiconductor die 705 and the second semiconductor die 710 may be of greater dimension that at least some other via structures (e.g., to pass a PDN current between the respective semiconductor dies, or according to a predefined layer height). The connection structure 725 includes or connects to a UBM 750. For example, the UBM may be a layer of the semiconductor device, or may be disposed over the semiconductor device to connect to a BGA bump or another connector such as a ground pad.

The fourth die connection terminal 712, and further die connection terminals (not depicted) may connect to additional connectors terminal to the semiconductor device 700 (not depicted), or other intra semi or other intra-semiconductor device 700 connections. Additionally or alternatively, additional connections may be defined between the various connections described herein (e.g., branches may interconnect connection tree stems).

Figure 8A:
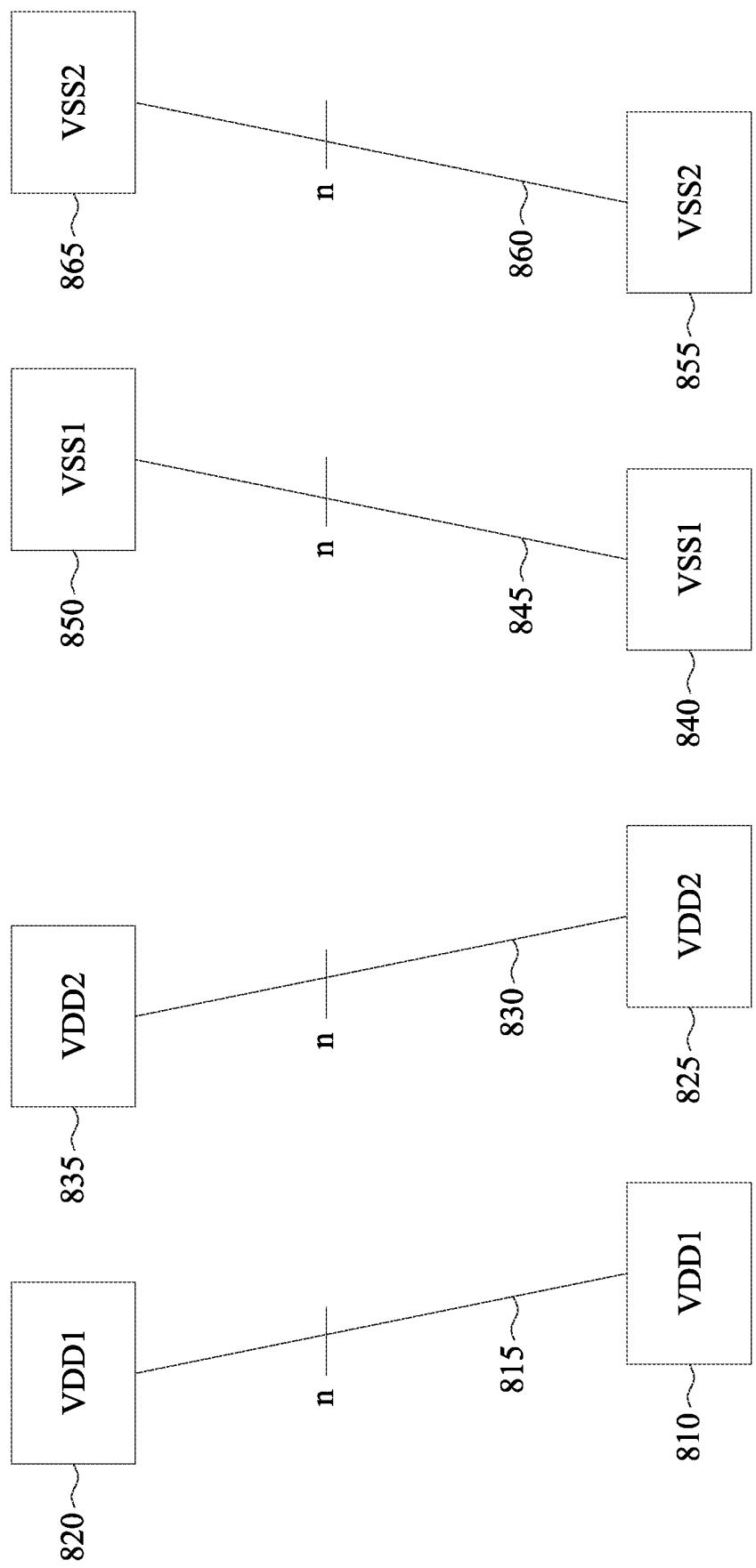
FIGS. 8a and 8b are logical representations of a connection tree, in accordance with some embodiments.

FIG. 8a is a logical representations of connection trees, in accordance with some embodiments. For example, the figure may represent a redistribution structure of the semiconductor device 600 of FIGS. 6a-6e. A lower VDD1 connection 810 is depicted connecting to a first connection tree stem 815 which is also connected to an upper VDD1 connection 820. For example, either of the lower VDD1 connection 810 or the upper VDD1 connection 820 may be a connection to a semiconductor die, a semiconductor package terminal, or another portion of a semiconductor device. The first connection tree stem 815 is depicted having n parallel connections. For example, n may be a single via structure disposed on each of one or more via structures of a semiconductor device, or a plurality of via structures disposed on a layer of a semiconductor device. In some embodiments, the number of parallel connections is not equal on various layers of the semiconductor device. For example, an embodiment wherein the connections are formed from the hexagonal connection structures of FIG. 2b may alternate between three and four via structures on each layer. Further, the connections on some layers may be increased or decreased. For example, terminal layers may contain additional or fewer connections (e.g., to interface with terminal connectors or silicon dies having limited surface area).

An additional VDD power tree is also disclosed, having a lower VDD2 connection 825 to a second connection tree stem 830 which is also connected to an upper VDD2 connection 835. The second connection tree stem 830 has a same thickness as the first connection tree stem 815. Further, a pair of VSS connections comprise a third connection tree stem 845 and a fourth connection tree stem 860 having a same thickness. The third connection tree stem connects a lower VSS1 connection 840, and an upper VSS1 connection 850. The fourth connection tree stem connects a lower VSS2 connection 855, and an upper VSS2 connection 865.

Figure 8B:
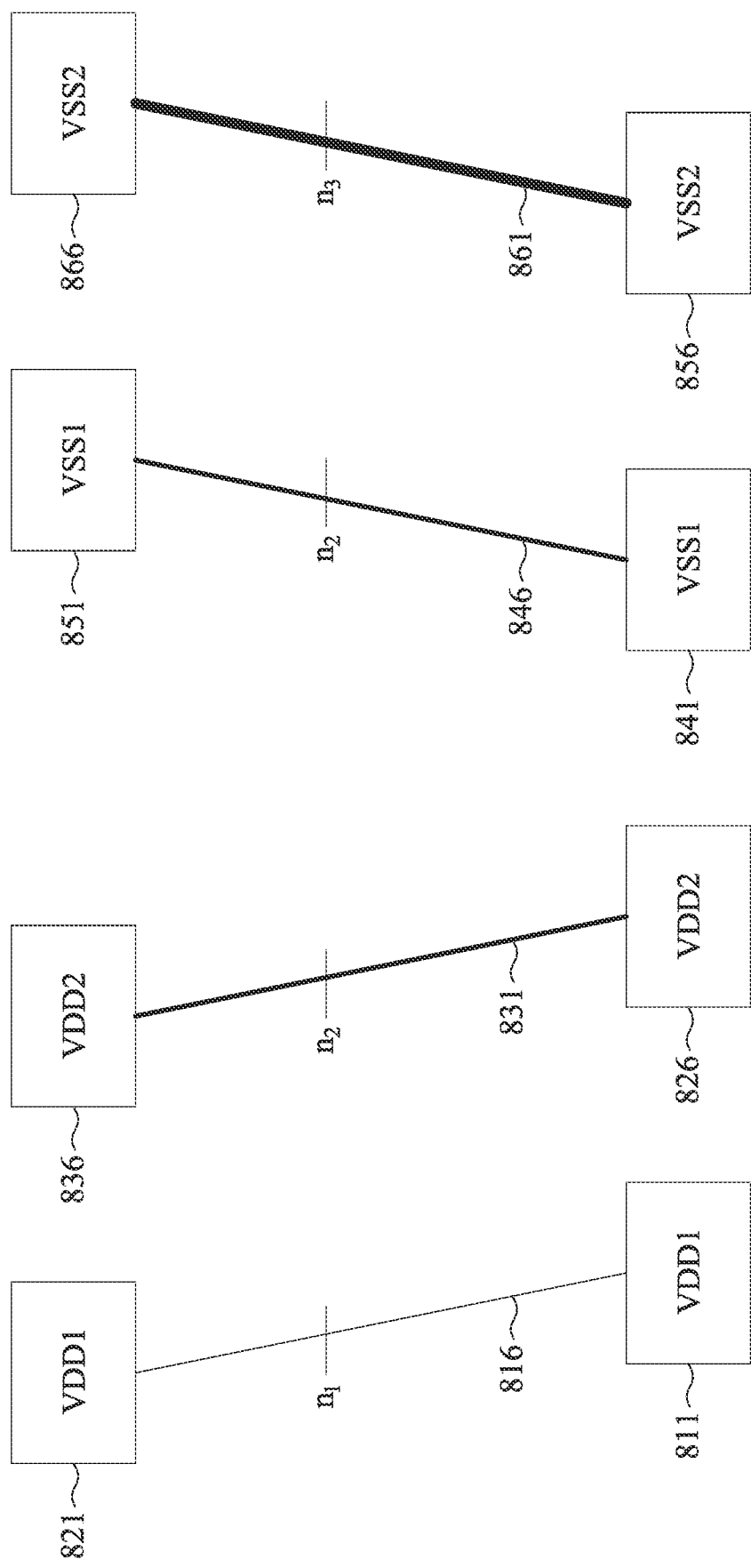

FIG. 8b is another logical representations of connection trees, in accordance with some embodiments. The connection trees depicted by FIG. 8b may be an alternative connection scheme to the connection trees depicted by FIG. 8a, or may be a variation thereof. For example, the connection trees of FIG. 8a may correlate to the establishment of core via structures (e.g., analogous to the core via structures of FIG. 6b), and the connection trees of FIG. 8b may include the secondary via structures added thereto (e.g., analogous to the secondary via structures 664 of FIG. 6c). A lower VDD1 connection 811 is connected to a first connection tree stem 816 which is also connected to an upper VDD1 connection 821. The first connection tree stem 816 includes $n_1$ connections. For example, $n_1$ may be a single via structure. In some embodiments, a single via structure may meet the connection guidelines for the connection. The selection of a single via structure stem vs another type of connection (e.g., a branch connection from another stem) may be related to routing the connection, or isolating the connection from various signals which can couple into another stem of a semiconductor device.

A lower VDD2 connection 826 is connected to a second connection tree stem 831 which is also connected to an upper VDD2 connection 836. VDD2 may be a different voltage or otherwise isolated from VDD1, or may be another connection of the same voltage which may be connected by various branch connections (not depicted). The second connection tree stem 831 has a number, $n_2$ of connections that are greater than the first connection tree stem 816. The greater number of connections may relate to a physical number of via structures or other connection elements, a geometry thereof (e.g., size, spacing, etc.), or an overall characteristic of the connection structure (e.g., impedance). Thus, the second connection tree stem 831 may be referred to as thicker than the first connection tree stem 816. The thicker connection tree stem may be a different pattern or a same pattern having different populated portions. For example, some via structures, conductive pads, and plane area of or associated with a pattern may be depopulated.

A lower VSS1 connection 841 is connected to a third connection tree stem 846 which is also connected to an upper VSS1 connection 851. The third connection tree stem 846 has a same thickness as the second connection tree stem 831. In some embodiments, the third connection tree stem 846 may be of the same pattern as the second connection tree stem 831. In some embodiments, the third connection tree stem 846 may be of a different pattern as the second connection tree stem 831. For example, the third connection tree stem 846 may connect VSS connections which are disposed laterally further than the second connection tree stem 831.

A larger pattern may be used to cover the larger lateral distance, and may be sparsely populated such that the larger pattern of the third connection tree stem 846 has a same thickness as the smaller pattern of the second connection tree stem 831. Some connection tree stems may be configured to provide laterally displaced connections without a larger overall pattern. For example, some connection tree stems may be or include offset patterns, such as concentric geometric patterns wherein the patterns disposed within adjacent layers are offset (e.g., by the pitch distance). Such patterns may cover a same or a larger lateral distance as a larger pattern. For example, a concentric hexagonal pattern of two concentric rings wherein each layer of the semiconductor is offset over six layers of a semiconductor device may connect a same lateral distance as a hexagonal pattern having five concentric rings, in some embodiments.

A lower VSS2 connection 856 is connected to a fourth connection tree stem 861 which is also connected to an upper VSS2 connection 866. The fourth connection tree stem 861 has a thickness which is greater than the third connection tree stem 846. The fourth connection tree stem has a number, $n_3$ of connections which are different than the third connection tree stem 846. For example, the fourth connection tree stem 861 may have a greater number of connections than the third connection tree stem 846.

Figure 9:
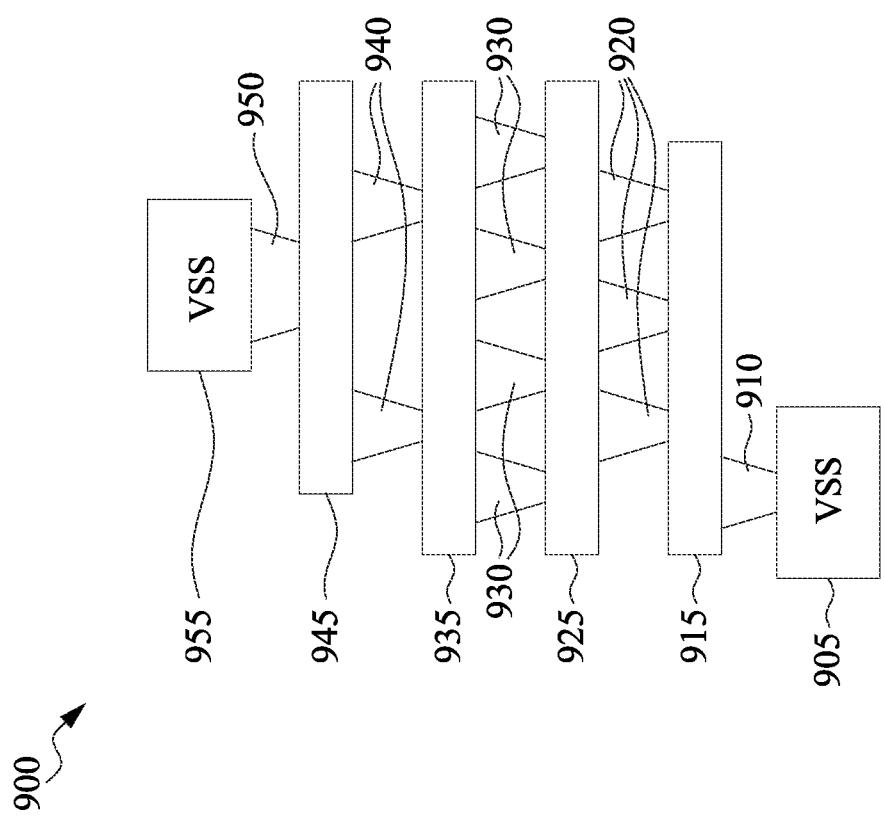
FIG. 9 includes a cross sectional view of a connection tree, in accordance with some embodiments.

FIG. 9 depicts a cross sectional view of a connection tree stem 900 of a connection diagram. For example, the stem may be one of the connection trees of FIGS. 8a-8b. A lower VSS connection 905 is depicted, which may be or be configured to connect to a die pad of a semiconductor die. For example, the lower VSS connection 905 may connect directly to a die pad, or may connect to a die pad (or other terminal) through an intermediate connection such as a ground rail. At least one first layer via structure 910 joins the lower VSS connection 905 to a first plane 915. The first plane 915 includes a includes a conductive pad to receive the first layer via structure 910, and a plurality of conductive pads to receive second layer via structures 920. The second layer via structures 920 and the first layer via structure 910 can be of a repeating pattern, and can be separated by a defined pitch. For example, each of the second layer via structures 920 can be separated by a center-to-center or lateral end-to-lateral end pitch of about 130 micrometers or about 150 micrometers. In some embodiments the pitch may be inter-layer. For example, the via structures between adjacent layers may have a minimum pitch of about 130 micrometers or about 150 micrometers, and the offset via structures within a layer may have a minimum pitch of about 260 micrometers or about 300 micrometers. For example, the spacing between adjacent footprints may be about 9 micrometers.

A second plane 925 includes conductive pads to receive the second layer via structures 920 and the third layer via structures 930. A third plane 935 includes conductive pads to receive the third layer via structures 930 and fourth layer via structures 940. In some embodiments, the second, third, and fourth layers are alternating patterns as depicted in FIG. 2a-2d or 4a-5h. In some embodiments, not every position of a pattern may be populated. For example, one or more third layer via structures 940 may be depopulated responsive to a metal density or routing requirement. Each pattern may include one or more population embodiments which may correspond with one or more thicknesses. For example, another embodiment of the depicted connection tree stem 900 may populate the fourth layer via structures 940 similarly to the second layer via structures 920, and may be associated with a greater thickness. A fourth plane 945 connects the fourth layer via structures 940 to a terminal connection 955 via structure an intermediate connection 950. For example, the terminal connection may be a connection of a semiconductor die or a package terminal of a semiconductor device and the intermediate connection 950 may be a bond wire, UBM, RDL, etc.

The various planes of the connection tree stem 900 may be extended, such as to connect to other planes, provide branch connections to other connection trees or other connectors. For example, the various planes may be expanded to form VSS planes across one or more layers of a semiconductor device (e.g., form an RDL) which may connect to various additional terminals, routs, etc. of various a semiconductor device.

Figure 10:
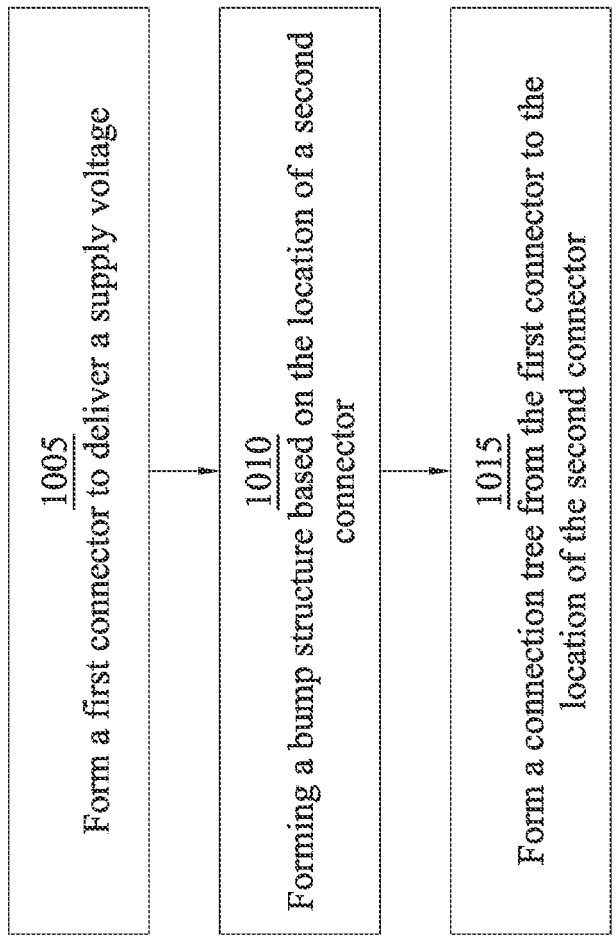
FIG. 10 includes a flowchart of an example method of forming a semiconductor device, in accordance with some embodiments.

FIG. 10 is a flowchart of an example method 1000 of forming a semiconductor device, in accordance with some embodiments. The method may be used to route, define, design, or otherwise form a semiconductor device. For example, at least some of the operations described in the method 1000 may result in the semiconductor devices and connection trees depicted in FIGS. 6a-9. The method 1000 is disclosed as a non-limiting example, and additional operations may be provided before, during, and after the method 1000 of FIG. 10. Further, some operations may only be described briefly herein, however, the disclosed operations may be performed in conjunction with other disclosed methods disclosed herein, or generally known in the art. For example, a plurality of connection trees may formed and interconnected therebetween to establish a PDN.

In brief summary, a first connector is formed to deliver a supply voltage at operation 1005. A bump structure is formed based on the location of a second connector to receive the supply voltage at operation 1010. At operation 1015, a connection tree is formed from the first connector to the location of the second connector. The operations may be performed in sequence, wherein operation 1010 is performed subsequent to operation 1005, and operation 1015 is performed subsequent to operation 1010.

Referring to operation 1005, a first connector is formed (e.g., defined) to deliver a supply voltage. The supply voltage may be a power or a ground. Some embodiments include a plurality of power and grounds. The first connector can connect to a semiconductor die. For example, the first connector may be or connect to a bond wire, die pad, power rail or other PDN element directly interfacing with a semiconductor die, or may directly interface with a semiconductor die. Forming the first connector includes defining the location of the first connector and may also include defining a material of the first connector, or a process to form the first connector for one or more nets of a netlist the first connector embodies. For example, the location, form or shape of the first connector may be determined according to a predefined connection tree parameter or with specific regard to a circuit. For example, a connection tree may be defined according to capacitance or resistance associated with a signal the connection tree carries or is located in proximity to. The location of the first connector may be adjusted by adjusting the location of a connector interface on a semiconductor die, a location of the semiconductor die within a device package, etc.

Referring to operation 1010, a location of a second connector to receive the supply voltage is identified, received, or otherwise established and a bump is formed based on the location. For example, the location may be disposed on a fan-out package having at least one lateral dimension in excess of that of a semiconductor die. The location includes a lateral location relative to the first connector. For example, the second connector may be disposed at a pre-defined lateral position associated with a standard package (e.g., DIP-16, BGA-144, fine BGA-1156, or QFP-44). In some embodiments, the second connector may be an external terminal connector (e.g., in a flip-chip C4 package). In some embodiments, the second connector may be an intermediate connection (e.g., a die pad for a bond wire or a UBM for a BGA bump in a flip-chip C4 package). The location can include a vertical location such as a z-height relative to the first connection. For example, the number and thicknesses of various layers of the semiconductor device may be defined (e.g., based on the package dimensions or additional design constrains).

Alternatively or additionally, the identification of the second connector may be based on properties of the semiconductor device (e.g., an expected current flow through a net of a netlist). A pinout of some or all pins of a semiconductor device can be defined based on the properties of a plurality of nets of the netlist. For example, a first portion of pins may be defined based on a convention for the package type, and a second portion may be available for routing. The routing may be based on a desired connection tree thickness. For example, thicker connection trees may be defined prior to thinner connection trees such that the thicker connection trees may benefit from prioritized routing. The identification of the second connector may be identifying a connector of an additional semiconductor die. For example, a semiconductor device can include a first semiconductor die (e.g., a processing die), and a second semiconductor device (e.g., a memory die). The first and second connections can be located on the respective dies. The identification of the second connector can also include an intermediate connection such as a UBM or an RDL. For example, a first connection tree may be defined between a semiconductor die and an RDL, and a second connection tree may be defined between the RDL and a semiconductor package terminal.

A bump structure can be formed based on the location of the second connector. For example, the bump structure can be a C4 bump, a C2 bump, or another conductive structure. The bump structure can be formed over a formed over a UBM or other intermediate conductor. The bump structure can be or be configured to connect to package terminal. For example, the bump can be a C4 bump to connect a first portion of a semiconductor device to an interposer or fan out structure of the semiconductor device, or to connect the semiconductor device to another substrate such as a printed circuit board. In some embodiments, the bump structure can connect to the package terminal through an intermediate connector such as through a TIV, TSV, RDL, fan out structure, or the like.

Referring to operation 1015, a connection tree is formed from the first connector to the location of the second connector. The formation of the connection tree may comprise sub-operations. For example, a first sub-operation may include defining a connection stem having one or more via structures per layer of the semiconductor device. For example, a connection tree between the first and the second connections on different layers may include one via structure per layer. The via structures may be connected by conductive pads which are electrically connected. The conductive pads may be a portion of a plane. A thickness of the connection can thereafter be applied to the connection tree by increasing a number of via structures on one or more layers of the semiconductor device. For example, the one or more via structures may correspond to a predefined pattern based on or including the thicknesses. In some embodiments, the pre-defined patterns include a population status of various via structures (e.g., all via structures or a portion thereof may be populated, according to a specified thickness). In some embodiments, the number of populated via structures may be determined according to a different sub-operation. For example, a pattern may be selected according to an approximate desired thickness or a lateral distance, and may thereafter have a number of populated via structures selected to achieve a desired thickness. The population of via structures may be based on desired metal density, routing requirements, or additional design rules associated with a fabrication process.

The conductive pads or planes of the connection structures may be expanded to interconnect with additional connection structures, conform to design rules, and connect to additional semiconductor device connections. For example, a subset of required connections may be assigned connection stems (e.g., based on a location, a current demand, a signal integrity requirement, etc.). Additional connections may be made with branch connections based on the assigned stems. The formation of the conductive structures may be iterative. For example, a connection structure having an initially defined thickness may thereafter be assigned a number of branch connections requiring greater or lesser thickness (e.g., a connection structure having a current capacity of 10 Amps may thereafter be assigned branch connections necessitating a total current capacity of 12 Amps). Thus, a check for voltage drop (e.g., an IR drop) may indicate that a greater thickness may be required. Alternatively or in additional such checks may be non-iterative. Connectivity checks may also be conducted (e.g., as an iterative or non-iterative check) which may verify the connectivity of the designated elements of the semiconductor device relative to a netlist of nets of the semiconductor device, or otherwise verify a layout versus schematic (LVS) capture of a circuit.

Disclosed herein are systems are power delivery structures and methods of manufacturing thereof. The power delivery structures include one or more layers of via structures, wherein at least a portion of the via structures are connected to a lateral redistribution structure. The via structures may be placed to minimize resistance. For example, the via structures may be placed at a position in a pre-defined pattern, which is nearest to a position of a terminal. The redistribution structures may be defined by the placement of the via structures, such that a position of one or more redistribution structures or portions thereof may be responsive to the placement of one or more via structures. In some embodiments, the pre-defined pattern may include one or more patterns configured to optimize resistance, density, signal integrity, etc. (e.g., may be a hexagonal pattern having alternating layers wherein each via structure connects to at least two via structures on an adjacent layer). The one or more patterns may be selected according to a target impedance of the structure, such as to minimize resistance, signal integrity, etc. For example, the plurality of pre-defined patterns may be of a concentric geometry, such that additional concentric bands can be added or removed (e.g., to lower resistance or area, respectively).

In one aspect of the present disclosure, a semiconductor device is disclosed. The semiconductor device includes a first connector, a second connector, and a redistribution structure disposed between the first connector and the second connector. The redistribution structure includes a first connection tree electrically connecting the first connector to the second connector. The first connection tree includes a plurality of first conductive pads disposed in a plurality of respective layers, and a plurality of first via structures each disposed between adjacent ones of the plurality of first conductive pads. Any lateral end of each of the plurality of first conductive pads is spaced from the first connector within a first minimum pitch associated with the second connector.

In another aspect of the present disclosure, a semiconductor device is disclosed. The semiconductor device includes multiple first connectors configured to deliver a first supply voltage and multiple second connectors configured to deliver a second supply voltage. The first connectors and the second connectors are disposed in a first layer. The semiconductor device further includes multiple third connectors configured to deliver the first supply voltage and multiple fourth connectors configured to deliver the second supply voltage. The plurality of third connectors and the plurality of fourth connectors are disposed in a second layer, and any adjacent ones of the of third and/or fourth connectors are spaced from each other with a pitch. The semiconductor device further includes a redistribution structure vertically disposed between the first layer and the second layer. The redistribution structure comprises a plurality of first connection trees and a plurality of second connection trees, each of the plurality of first connection trees are configured to electrically connect one of the first connectors to a corresponding one of the third connectors. Each of the plurality of second connection trees are configured to electrically connect one of the second connectors to a corresponding one of the fourth connectors. A first lateral distance between any end of each of the first connection trees and the corresponding first connector is less than the pitch and a second distance between any end of each of the second connection trees and the corresponding second connector is also less than the pitch.

In yet another aspect of the present disclosure, a method for fabricating semiconductor devices is disclosed. The method includes forming a first connector over a semiconductor chip, wherein the first connector is configured to deliver a supply voltage to the semiconductor chip. The method includes identifying a location of a second connector, wherein the second connector is configured to receive the supply voltage through a bump structure. The method includes forming a connection tree extending from the first connector to the location of the second connector. The connection tree includes a plurality of conductive pads in a plurality of respective layers, and a plurality of via structures disposed between adjacent ones of the plurality of conductive pads. Any lateral end of each of the plurality of conductive pads is spaced from the first connector within a minimum pitch associated with the second connector.

In yet another aspect of the present disclosure, a method for fabricating semiconductor devices is disclosed. The method includes forming a first connector over a semiconductor chip, wherein the first connector is configured to deliver a supply voltage to the semiconductor chip. The method includes forming a bump structure based on a location of a second connector, wherein the bump structure is configured to deliver the supply voltage to the second connector. The method includes forming a connection tree extending from the first connector to the location of the second connector. The connection tree includes a plurality of conductive pads in a plurality of respective layers, and a plurality of via structures disposed between adjacent ones of the plurality of conductive pads. Any lateral end of each of the plurality of conductive pads is spaced from the first connector within a minimum pitch associated with the second connector.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first connector;
    a second connector;
    a third connector laterally disposed next to the first connector;
    a fourth connector laterally disposed next to the second connector; and
    a redistribution structure disposed between the first connector and the second connector, comprising:
        a first connection tree electrically connecting the first connector to the second connector wherein the first connection tree comprises: (a) a plurality of first conductive pads disposed in a plurality of levels, respectively; and (b) a plurality of first via structures each disposed between adjacent ones of the plurality of first conductive pads; and
        a second connection tree electrically connecting the third connector to the fourth connector wherein the second connection tree comprises: (a) a plurality of second conductive pads disposed in the plurality of levels, respectively; and (b) a plurality of second via structures each disposed between adjacent ones of the plurality of second conductive pads,
    wherein any lateral end of each of the plurality of first conductive pads is spaced from the first connector within a first minimum pitch associated with the second connector,
    wherein any lateral end of each of the plurality of second conductive pads is spaced from the third connector within a second minimum pitch associated with the fourth connector.

2. The semiconductor device of claim 1, wherein the first connector and the second connector are configured to deliver a same power supply voltage.

3. The semiconductor device of claim 1, wherein the first minimum pitch is about 150 micrometers ($\mu m$).

4. The semiconductor device of claim 1, further comprising:
    a semiconductor chip comprising: (a) a plurality of device features; (b) a plurality of metallization layers disposed over the device features; and (c) a plurality of second conductive pads disposed over a topmost one of the metallization layers, wherein the first connector is connected to a corresponding one of the plurality of second conductive pads; and
    a bump structure connected to the second connector.

5. The semiconductor device of claim 1, wherein the first minimum pitch and the second minimum pitch are equal to each other, each of which is defined as a lateral spacing between the second connector and the fourth connector.

6. The semiconductor device of claim 1, wherein the first and second connectors are configured to deliver a first supply voltage, and the third and fourth connectors are also configured to deliver the first supply voltage.

7. The semiconductor device of claim 6, further comprising a plurality of conductive planes disposed in the plurality of levels, respectively, wherein the plurality of conductive planes are in electrical contact with the first conductive pads and the second conductive pads.

8. The semiconductor device of claim 1, wherein the first and second connectors are configured to deliver a first supply voltage, and the third and fourth connectors are configured to deliver a second, different supply voltage.

9. The semiconductor device of claim 8, further comprising:
- a plurality of first conductive planes disposed in the plurality of levels, respectively, wherein the plurality of first conductive planes are in electrical contact with the first conductive pads; and
- a plurality of second conductive planes disposed in the plurality of levels, respectively, wherein the plurality of second conductive planes are in electrical contact with the second conductive pads.

10. A semiconductor device, comprising:
- a plurality of first connectors configured to deliver a first supply voltage;
- a plurality of second connectors configured to deliver a second supply voltage, wherein the plurality of first connectors and the plurality of second connectors are disposed in a first layer;
- a plurality of third connectors configured to deliver the first supply voltage;
- a plurality of fourth connectors configured to deliver the second supply voltage, wherein the plurality of third connectors and the plurality of fourth connectors are disposed in a second layer, and any adjacent ones of the plurality of third and/or fourth connectors are spaced from each other with a pitch; and
- a redistribution structure vertically disposed between the first layer and the second layer;
- wherein the redistribution structure comprises a plurality of first connection trees and a plurality of second connection trees, each of the plurality of first connection trees configured to electrically connect one of the first connectors to a corresponding one of the third connectors, each of the plurality of second connection trees configured to electrically connect one of the second connectors to a corresponding one of the fourth connectors; and
- wherein a first lateral distance between any end of each of the first connection trees and the corresponding first connector is less than the pitch, and a second distance between any end of each of the second connection trees and the corresponding second connector is also less than the pitch.

11. The semiconductor device of claim 10, wherein the pitch is about 150 micrometers (μm).

12. The semiconductor device of claim 10, wherein the first supply voltage is VDD, and the second supply voltage is VSS.

13. The semiconductor device of claim 10, wherein each of the first connection trees comprises: (a) a plurality of first conductive pads disposed in a plurality of levels, respectively; and (b) a plurality of first via structures each disposed between adjacent ones of the plurality of first conductive pads; and
each of the second connection trees comprises: (a) a plurality of second conductive pads disposed in the plurality of levels, respectively; and (b) a plurality of second via structures each disposed between adjacent ones of the plurality of second conductive pads.

14. The semiconductor device of claim 13, further comprising:
- a plurality of first conductive planes disposed in the plurality of levels, respectively, wherein the plurality of first conductive planes are in electrical contact with the respective first conductive pads of the first connection trees; and
- a plurality of second conductive planes disposed in the plurality of levels, respectively, wherein the plurality of second conductive planes are in electrical contact with the respective second conductive pads of the second connection trees.

15. The semiconductor device of claim 10, wherein the plurality of first connectors and the plurality of second connectors are disposed above a topmost metallization layer of a semiconductor chip, with the plurality of third connectors and the plurality of fourth connectors each connected to a bump structure.

16. A method for fabricating semiconductor devices, comprising:
- forming a first connector over a semiconductor chip, wherein the first connector is configured to deliver a supply voltage to the semiconductor chip;
- forming a bump structure based on a location of a second connector, wherein the bump structure is configured to deliver the supply voltage to the second connector; and
- forming a connection tree extending from the first connector to the location of the second connector, wherein the connection tree comprises: (a) a plurality of conductive pads disposed in a plurality of levels, respectively; and (b) a plurality of via structures each disposed between adjacent ones of the plurality of conductive pads;
- wherein any lateral end of each of the plurality of conductive pads is spaced from the first connector within a minimum pitch associated with the second connector.

17. The method of claim 16, further comprising:
forming the second connector based on the location; and
forming a plurality of conductive planes disposed in the plurality of levels, respectively, wherein the plurality of conductive planes are in electrical contact with the conductive pads.

18. The method of claim 17, further comprising:
performing a connectivity check on the connection tree; and
performing an IR check on the connection tree.

* * * * *